(12) United States Patent
Morgan et al.

(10) Patent No.: US 9,732,938 B2
(45) Date of Patent: Aug. 15, 2017

(54) ILLUMINATION PANEL

(71) Applicant: MORGAN SOLAR INC., Toronto (CA)

(72) Inventors: John Paul Morgan, Toronto (CA); Michael Sinclair, Toronto (CA); Nigel Morris, Toronto (CA); Pascal Dufour, Toronto (CA); Stefan Myrskog, Maple (CA); Brett Barnes, Toronto (CA); Philip Chang, Toronto (CA); Stephen Caelers, Oakville (CA)

(73) Assignee: MORGAN SOLAR INC., Toronto (CA)

( * ) Notice: Subject to any disclaimer, the term of this patent is extended or adjusted under 35 U.S.C. 154(b) by 0 days.

(21) Appl. No.: 14/218,037

(22) Filed: Mar. 18, 2014

(65) Prior Publication Data

US 2014/0286017 A1    Sep. 25, 2014

Related U.S. Application Data

(60) Provisional application No. 61/798,205, filed on Mar. 15, 2013.

(51) Int. Cl.
*F21V 7/00* (2006.01)
*F21V 7/04* (2006.01)
(Continued)

(52) U.S. Cl.
CPC ............. *F21V 7/04* (2013.01); *B32B 37/12* (2013.01); *F21V 7/00* (2013.01); *F21V 13/04* (2013.01);
(Continued)

(58) Field of Classification Search
CPC . H01L 31/0543; G02B 6/0001; G02B 6/0036; G02B 6/004; G02B 6/0043;
(Continued)

(56) References Cited

U.S. PATENT DOCUMENTS 4,045,245 A    8/1977    Coleman et al.
4,148,299 A    4/1979    Sherman
(Continued)

FOREIGN PATENT DOCUMENTS

CN    202134560 U    2/2012
DE    112009002652 T5    6/2012
(Continued)

OTHER PUBLICATIONS

International Search Report from PCT/US2014/031002; Sep. 24, 2014; Charlotte Albayrak.
(Continued)

*Primary Examiner* — Alexander Garlen
(74) *Attorney, Agent, or Firm* — BCF LLP

(57) ABSTRACT

Illumination panel comprises: (1) a receiver substrate assembly including: (a) a rigid sheet of light transmissive material having a first surface, a second surface opposite the first surface, and a conductor pattern attached to the first surface; and (b) at least one receiver assembly affixed to the rigid sheet, each receiver assembly including a light source in electrical communication with the conductor pattern; and (2) at least one light-guide optic attached to and supported by the receiver substrate assembly, each light-guide optic in optical communication with the photovoltaic cell of an associated one of the at least one receiver assembly for guiding light for output via the rigid sheet.

22 Claims, 29 Drawing Sheets

US 9,732,938 B2

Page 2

(51) Int. Cl.
| | |
|---|---|
| *H01L 31/0525* | (2014.01) |
| *H02S 40/00* | (2014.01) |
| *F21V 29/502* | (2015.01) |
| *F21V 13/04* | (2006.01) |
| *F21V 8/00* | (2006.01) |
| *H01L 31/054* | (2014.01) |
| *B32B 37/12* | (2006.01) |
| *F21V 17/02* | (2006.01) |
| *F21V 29/00* | (2015.01) |
| *G01J 1/04* | (2006.01) |
| *G01J 1/42* | (2006.01) |
| *H01L 31/02* | (2006.01) |
| *H01L 31/048* | (2014.01) |
| *H01L 31/05* | (2014.01) |
| *H01L 31/052* | (2014.01) |
| *H01L 31/0687* | (2012.01) |
| *H02S 40/22* | (2014.01) |

(52) U.S. Cl.
CPC .............. *F21V 17/02* (2013.01); *F21V 29/004* (2013.01); *F21V 29/502* (2015.01); *G01J 1/0414* (2013.01); *G01J 1/42* (2013.01); *G02B 6/0001* (2013.01); *H01L 31/02013* (2013.01); *H01L 31/048* (2013.01); *H01L 31/052* (2013.01); *H01L 31/0508* (2013.01); *H01L 31/0525* (2013.01); *H01L 31/0543* (2014.12); *H01L 31/0547* (2014.12); *H01L 31/0687* (2013.01); *H02S 40/00* (2013.01); *H02S 40/22* (2014.12); *Y02E 10/52* (2013.01); *Y02E 10/544* (2013.01); *Y02P 70/521* (2015.11); *Y10T 29/49826* (2015.01)

(58) Field of Classification Search
CPC  G02B 6/005; G02B 19/0047; G02B 19/0066; F21V 5/004; F21V 7/0083
See application file for complete search history.

(56) References Cited

U.S. PATENT DOCUMENTS

| | | | |
|---|---|---|---|
| 4,337,758 A | 7/1982 | Meinel et al. | |
| 4,877,460 A | 10/1989 | Floedl | |
| 4,962,450 A * | 10/1990 | Reshetin | F21S 48/1329 362/268 |
| 4,975,814 A * | 12/1990 | Schairer | B60Q 1/2696 257/E25.02 |
| 5,197,792 A | 3/1993 | Jiao et al. | |
| 5,528,057 A | 6/1996 | Yanagase et al. | |
| 5,791,757 A | 8/1998 | O'Neil et al. | |
| 5,897,184 A | 4/1999 | Eichenlaub et al. | |
| 5,914,760 A | 6/1999 | Daiku | |
| 6,097,549 A | 8/2000 | Jenkins et al. | |
| 6,307,145 B1 | 10/2001 | Kataoka et al. | |
| 6,578,989 B2 * | 6/2003 | Osumi | H01L 33/54 257/98 |
| 6,811,277 B2 | 11/2004 | Amano | |
| 6,906,459 B2 | 6/2005 | Suehiro | |
| 6,951,415 B2 | 10/2005 | Amano et al. | |
| 6,987,613 B2 | 1/2006 | Pocius et al. | |
| 7,021,805 B2 | 4/2006 | Amano et al. | |
| 7,072,096 B2 | 7/2006 | Holman et al. | |
| 7,083,313 B2 | 8/2006 | Smith | |
| 7,152,985 B2 | 12/2006 | Benitez et al. | |
| 7,160,010 B1 | 1/2007 | Chinniah et al. | |
| 7,290,906 B2 | 11/2007 | Suzuki et al. | |
| 7,316,496 B2 * | 1/2008 | Wu | G02F 1/133603 313/500 |
| 7,391,939 B1 | 6/2008 | Williams | |
| 7,431,481 B2 | 10/2008 | Stefanov | |
| 7,467,879 B2 | 12/2008 | Herloski et al. | |
| 7,626,761 B2 | 12/2009 | Haga et al. | |
| 7,664,350 B2 | 2/2010 | Ghosh et al. | |
| 7,672,549 B2 | 3/2010 | Ghosh et al. | |
| 7,697,219 B2 | 4/2010 | DiDomenico | |
| 7,740,392 B2 | 6/2010 | Itoh et al. | |
| 7,794,100 B2 | 9/2010 | Ito | |
| 7,855,335 B2 | 12/2010 | Maeda | |
| 7,873,257 B2 | 1/2011 | Morgan | |
| 7,925,129 B2 | 4/2011 | Ghosh et al. | |
| 8,030,569 B2 | 10/2011 | Nakata | |
| 8,067,688 B2 | 11/2011 | Gronet | |
| 8,279,164 B2 | 10/2012 | Daiku | |
| 8,328,403 B1 | 12/2012 | Morgan et al. | |
| 8,412,010 B2 | 4/2013 | Ghosh et al. | |
| 8,586,860 B2 | 11/2013 | Nakata | |
| 8,609,455 B2 | 12/2013 | Krasnov et al. | |
| 8,885,995 B2 | 11/2014 | Morgan | |
| 2002/0024808 A1 * | 2/2002 | Suehiro | G09F 9/33 362/245 |
| 2005/0030960 A1 | 2/2005 | Sumida et al. | |
| 2005/0212397 A1 | 9/2005 | Murazaki et al. | |
| 2005/0265029 A1 | 12/2005 | Epstein et al. | |
| 2006/0060867 A1 | 3/2006 | Suehiro | |
| 2007/0002566 A1 | 1/2007 | Wu et al. | |
| 2007/0181901 A1 * | 8/2007 | Loh | H01L 33/58 257/99 |
| 2007/0189017 A1 | 8/2007 | Hofmann | |
| 2007/0217202 A1 | 9/2007 | Sato | |
| 2007/0236927 A1 | 10/2007 | Liu | |
| 2007/0251568 A1 | 11/2007 | Maeda | |
| 2007/0256724 A1 | 11/2007 | Fork et al. | |
| 2007/0256725 A1 | 11/2007 | Fork et al. | |
| 2007/0256726 A1 | 11/2007 | Fork et al. | |
| 2007/0279910 A1 | 12/2007 | Lin | |
| 2008/0087321 A1 | 4/2008 | Schwartzman | |
| 2008/0087323 A1 | 4/2008 | Araki et al. | |
| 2008/0316761 A1 | 12/2008 | Minano et al. | |
| 2009/0002997 A1 | 1/2009 | Koester | |
| 2009/0071467 A1 | 3/2009 | Benitez et al. | |
| 2009/0165842 A1 | 7/2009 | McDonald et al. | |
| 2009/0188546 A1 | 7/2009 | McGlynn et al. | |
| 2009/0213607 A1 | 8/2009 | Tatsukawa | |
| 2009/0223555 A1 | 9/2009 | Ammar | |
| 2009/0256999 A1 | 10/2009 | Ogasawara et al. | |
| 2009/0277498 A1 | 11/2009 | Angel | |
| 2010/0012169 A1 | 1/2010 | Jensen et al. | |
| 2010/0024866 A1 | 2/2010 | Durvasula et al. | |
| 2010/0024868 A1 | 2/2010 | Baruchi et al. | |
| 2010/0043864 A1 | 2/2010 | Young et al. | |
| 2010/0051102 A1 | 3/2010 | Lin | |
| 2010/0059108 A1 | 3/2010 | McDonald et al. | |
| 2010/0103349 A1 | 4/2010 | Schmidt et al. | |
| 2010/0116319 A1 | 5/2010 | Martinez Anton et al. | |
| 2010/0116336 A1 | 5/2010 | Martinez Anton et al. | |
| 2010/0126554 A1 | 5/2010 | Morgan et al. | |
| 2010/0165495 A1 | 7/2010 | Murtha | |
| 2010/0186798 A1 | 7/2010 | Tormen et al. | |
| 2010/0224232 A1 | 9/2010 | Cummings et al. | |
| 2010/0252107 A1 | 10/2010 | Suga | |
| 2010/0278480 A1 | 11/2010 | Vasylyev | |
| 2010/0307565 A1 | 12/2010 | Suga | |
| 2011/0011449 A1 | 1/2011 | Morgan et al. | |
| 2011/0044000 A1 | 2/2011 | Minano et al. | |
| 2011/0096426 A1 | 4/2011 | Ghosh et al. | |
| 2011/0120539 A1 | 5/2011 | Minano et al. | |
| 2011/0132426 A1 | 6/2011 | Kang et al. | |
| 2011/0132432 A1 | 6/2011 | Schultz et al. | |
| 2011/0155210 A1 | 6/2011 | Kim et al. | |
| 2011/0155221 A1 | 6/2011 | Yu et al. | |
| 2011/0214738 A1 | 9/2011 | Halahmi et al. | |
| 2011/0292655 A1 | 12/2011 | Ing et al. | |
| 2012/0055552 A1 | 3/2012 | Morgan et al. | |
| 2012/0099325 A1 | 4/2012 | Ghosh et al. | |
| 2012/0112557 A1 | 5/2012 | Sager | |
| 2012/0145221 A1 | 6/2012 | Ozaki et al. | |
| 2012/0152331 A1 | 6/2012 | Luo | |
| 2012/0160300 A1 | 6/2012 | Munro | |
| 2012/0167949 A1 | 7/2012 | Dentinger et al. | |
| 2012/0247537 A1 | 10/2012 | Mei | |
| 2012/0255594 A1 | 10/2012 | Bishnoi et al. | |

(56) References Cited

U.S. PATENT DOCUMENTS

| | | |
|---|---|---|
| 2012/0287671 A1 | 11/2012 | Parker et al. |
| 2012/0298181 A1 | 11/2012 | Cashion et al. |
| 2012/0298182 A1 | 11/2012 | Hwang |
| 2012/0312356 A1 | 12/2012 | Mizuo et al. |
| 2012/0318319 A1 | 12/2012 | Pinarbasi et al. |
| 2013/0024293 A1 | 1/2013 | Tinsman et al. |
| 2013/0104984 A1 | 5/2013 | Myrskog |
| 2013/0118559 A1 | 5/2013 | Castillo et al. |
| 2013/0233384 A1 | 9/2013 | Morgan et al. |
| 2013/0247960 A1 | 9/2013 | Morgan |
| 2013/0276866 A1 | 10/2013 | Maeda |
| 2013/0284237 A1 | 10/2013 | Lin et al. |
| 2013/0298901 A1 | 11/2013 | Ruiz et al. |

FOREIGN PATENT DOCUMENTS

| | | |
|---|---|---|
| EP | 1715260 A2 | 10/2006 |
| EP | 1732141 A1 | 12/2006 |
| EP | 1895228 A1 | 3/2008 |
| EP | 2061092 A1 | 5/2009 |
| EP | 2068378 A2 | 6/2009 |
| EP | 2105682 A2 | 9/2009 |
| EP | 2234177 A1 | 9/2010 |
| EP | 2492966 A1 | 8/2012 |
| GB | 2468410 A | 9/2010 |
| JP | 03253833 | 12/1991 |
| JP | 06160638 | 7/1994 |
| JP | 10012024 | 1/1998 |
| JP | 11271749 | 10/1999 |
| JP | 2006114239 | 4/2006 |
| JP | 2006318807 | 11/2006 |
| JP | 2007012416 A | 1/2007 |
| JP | 2007033803 | 2/2007 |
| JP | 2010101912 | 5/2010 |
| JP | 2013080832 A | 5/2013 |
| WO | 03056876 A2 | 7/2003 |
| WO | 2009/002281 A2 | 12/2008 |
| WO | 2010033632 A2 | 3/2010 |
| WO | 2010033859 A2 | 3/2010 |
| WO | 2010124028 A2 | 10/2010 |
| WO | 2011011885 A1 | 2/2011 |
| WO | 2011022631 A2 | 2/2011 |
| WO | 2011120148 A1 | 10/2011 |
| WO | 2012014088 A2 | 2/2012 |
| WO | 2012085461 A1 | 6/2012 |
| WO | 2013/010313 A1 | 1/2013 |
| WO | 2014005102 A1 | 1/2014 |

OTHER PUBLICATIONS

International Search Report from PCT/US2014/031076; Jul. 16, 2014; Charlotte Albayrak.
English abstract of JP2007012416; retrieved from Espacenet on May 7, 2015.
English Abstract of EP 1 895 228; retrieved from Espacenet on Dec. 18, 2014.
Patent abstracts of Japan of JP 02-277033.
Patent abstracts of Japan of JP 03-253833.
Patent abstracts of Japan of JP 06-160638.
English Abstract of JP 1012024; retrieved from Espacenet on Dec. 18, 2014.
English Abstract of JPH11271749; retrieved from Espacenet on Dec. 18, 2014.
English Abstract of JP2006114239; retrieved from Espacenet on Dec. 18, 2014.
English Abstract of JP2006318807; retrieved from Espacenet on Dec. 18, 2014.
English Abstract of JP2007033803; retrieved from Espacenet on Dec. 18, 2014.
English Abstract of JP2010101912; retrieved from Espacenet on Dec. 18, 2014.
English Abstract of CN202134560; retrieved from Espacenet on Dec. 18, 2014.
U.S. Appl. No. 61/274,735, filed Aug. 20, 2009.
Hallas et al; Lateral translation micro-tracking of planar micro-optic solar concentrator; High and Low Concentrator Systems for Solar Electric Applications V, edited by Lori E Greene, Raed A. Sherif; vol. 7769 776904-1.
Sakurada et al; Simulation of Temperature Characteristics of InGaP/InGaAs/Ge-Triple-Junction Solar Cell under Concentrated Light; Japanese Journal of Applied Physics 50 (2011) 04DP13; 4 pages.
Winston; Thermodynamically efficient Nonimaging Optics; Dan David Symposium; University of California MERCED; Sep. 26, 2008; 42 pages.
Solfocus; Concentrated Photovoltaics, Solfocus; Feb. 13, 2013; 3 pages.
Winston et al.; Planar concentrators near the étendue limit; Optics Letters; vol. 30, No. 19; Oct. 1, 2005; pp. 2617-2619.
Victoria et al; Optical Characterization of FluidReflex Concentrator; Politecnica Instituto de Energia Solar; 6 Iternational Conference on Concentrating Photovoltaic Systems; Apr. 9, 2010.
Steiner et al.; Increasing the Energy Yield of CPV Modules through Optimized Solar Cell Interconnection; 7th International Conference on Concentrating Photovoltaic Systems; AIP Conference Proceedings 1407, 404 (2011); Published by the AIP Publishing; pp. 404-408.
Karp et al.; Planar micro-optic solar concentration using multiple imaging lenses into a common slab waveguide; Photonics Systems Integration Lab; University of California San Diego Jacobs School of Engineering; Aug. 4, 2009; 22 pages.
Unger, Blair L.; Dimpled Planar Lightguide Solar Concentrators; ProQuest Dissertations and Theses; 2010; ProQuest Dissertations & Theses (PQDT); The Institute of Optics Arts, Sciences and Engineering, Edmund A. Hajim School of Engineering and Applied Science; University of Rochester; Rochester, New York.
English abstract of DE 112009002652 retrieved from Espacenet on Feb. 21, 2017.

* cited by examiner

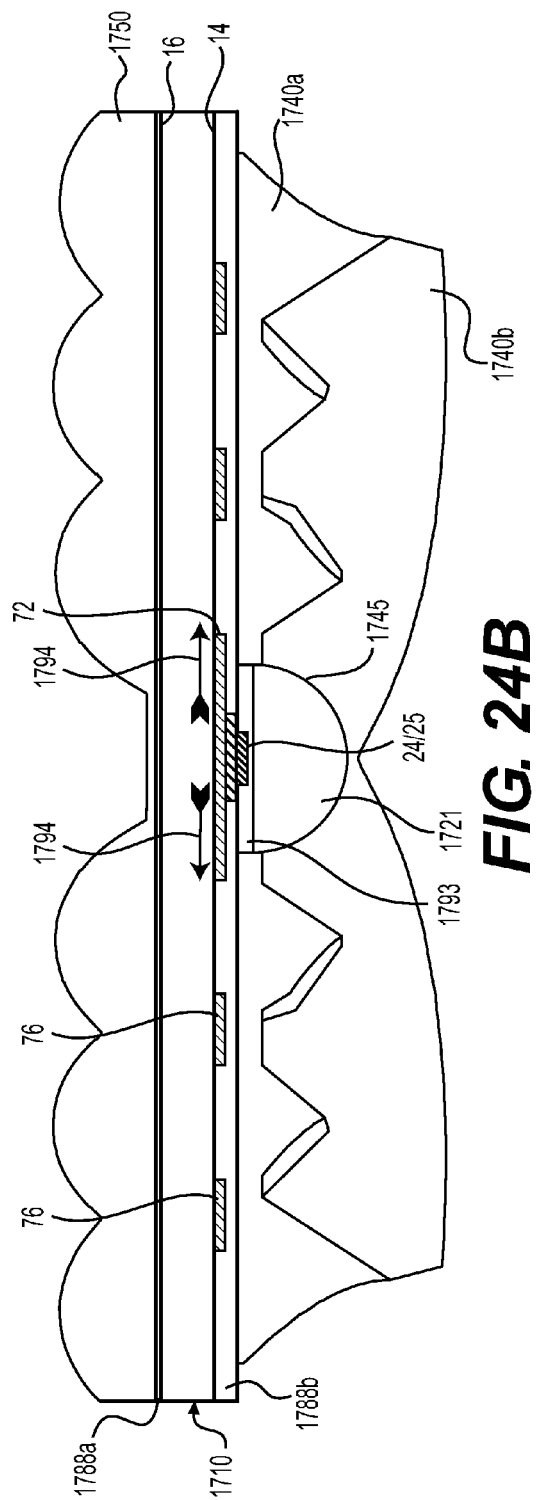
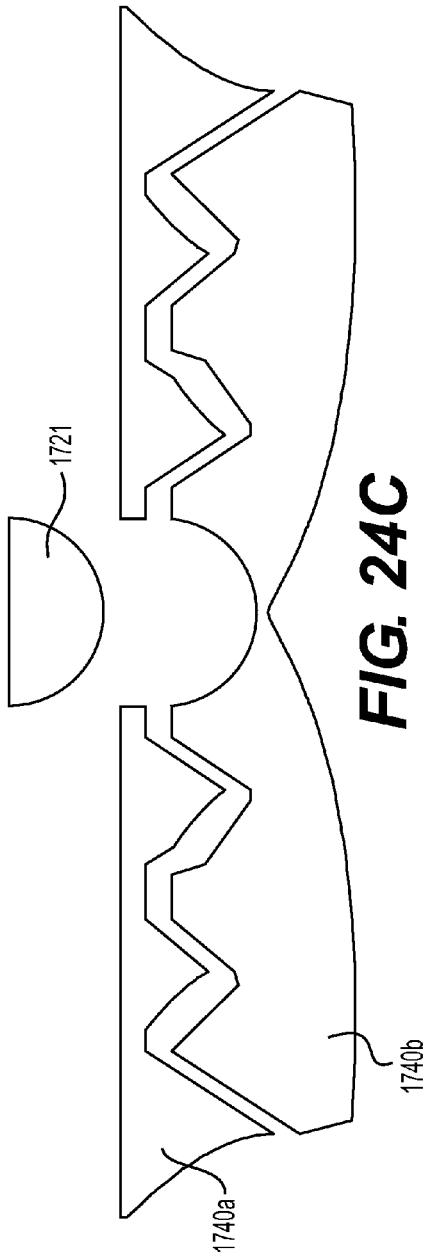
FIG. 24B
FIG. 24C

ILLUMINATION PANEL

CROSS-REFERENCE

The present application claims priority to U.S. Provisional Patent Application No. 61/798,205, filed Mar. 15, 2013 the entirety of which is incorporated herein by reference for all purposes.

FIELD

The present technology relates to illumination panels.

BACKGROUND

In an effort to protect Earth's environment and to conserve natural resources, the reduction of greenhouse gas emissions has been identified as a priority by governments around the world. One way to reduce greenhouse gas emissions is to reduce energy consumption. The consumption of energy can be reduced by using energy efficient devices, including illumination devices.

Optical illumination devices and systems using planar or slab light guides are energy efficient illumination devices. Such illumination devices typically include various layers of optically transmissive layers or media. Conventionally such illumination devices may be divided into a layer that receives and guides light from one or more light sources for insertion into a layer that redirects the light for emission from the illumination device. Depending on the configuration and construction of a particular illumination device, these layers may be areas of a unitarily manufactured structure or may be separate physical structures that have been separately manufactured and subsequently brought together to form a single structure that operates as a unit. Where the layers are manufactured separately and are subsequently assembled to form a unit, the optically active elements of the unit must be carefully aligned, therefore a high degree of precision is required in the assembly of each illumination device.

An energy efficient illumination device that is simpler to manufacture is therefore desirable.

SUMMARY

It is an object of the present technology to ameliorate at least some of the inconveniences present in the prior art.

In one aspect, embodiments of the present technology provide an illumination panel comprising:
a receiver substrate assembly including:
  a rigid sheet of light transmissive material having a first surface, a second surface opposite the first surface, and a conductor pattern attached to the first surface; and
  at least one receiver assembly affixed to the rigid sheet, each receiver assembly including a light source in electrical communication with the conductor pattern;
at least one light-guide optic attached to and supported by the receiver substrate assembly, each light-guide optic in optical communication with the light source of an associated one of the at least one receiver assembly for guiding light for output via the rigid sheet.

In some embodiments the at least one light-guide optic is attached to and supported by the first surface of the receiver substrate assembly.

In some embodiments the concentrated photovoltaic panel of further comprises at least one focusing optic attached to and supported by the second surface of the receiver substrate assembly, each focusing optic being associated with and in optical communication with one of the at least one light-guide optic, each focusing optic comprising at least one focusing element for cooperative operation with the light-guide optic.

In some embodiments each light-guide optic comprises at least one reflective surface for guiding light received from the light source out through the receiver substrate assembly.

In some embodiments the at least one focusing element includes a lens.

In some embodiments the metalization pattern includes two or more bus bars.

In some embodiments the light transmissive material of the rigid sheet is a thermally insulating material.

In some embodiments the light transmissive material of the rigid sheet is glass.

In some embodiments the first and second surfaces of the rigid sheet are flat and parallel to each other.

In some embodiments the light-guide optic is made of a different material than the rigid sheet.

In some embodiments the light-guide optic is made of poly(methyl) methacrylate.

In some embodiments the focusing optic is made of a different material than the rigid sheet.

In some embodiments the focusing optic is made of poly(methyl) methacrylate.

In some embodiments at least one of the at least one light-guide optic and the at least one focusing optic is 3D printed onto the rigid sheet.

In some embodiments the conductor pattern comprises at least two bus bars and a plurality of interconnection traces for electrical connection of the at least one receiver assembly to the bus bars.

In some embodiments the conductor pattern comprises a heat spreader portion.

In some embodiments the heat spreader portions comprises a positive half and a negative half, each half comprising a plurality of arms in the shape of circular arcs and a terminus interconnected by an interconnection trace.

In some embodiments the conductor pattern is metalized onto the first surface.

In some embodiments the conductor pattern is formed from a sheet of conductive material.

In some embodiments the conductor pattern is disposed between the rigid sheet and one of the light guide optic and the focusing optic, and the heat spreader portion is shaped and positioned so as to avoid blocking light transmitted from the focusing optic to the reflecting surfaces of the light guide optic.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIGS. 24A and 24B show cross-sectional views of an embodiment of an optical unit transmitting light through the gaps in a heat spreader portion, and where the light guide optic has a redirecting portion and a guiding portion;

FIG. 24C is an exploded view of the light guide optic and envelope of FIGS. 24A and 24B

DETAILED DESCRIPTION

Figure 2:
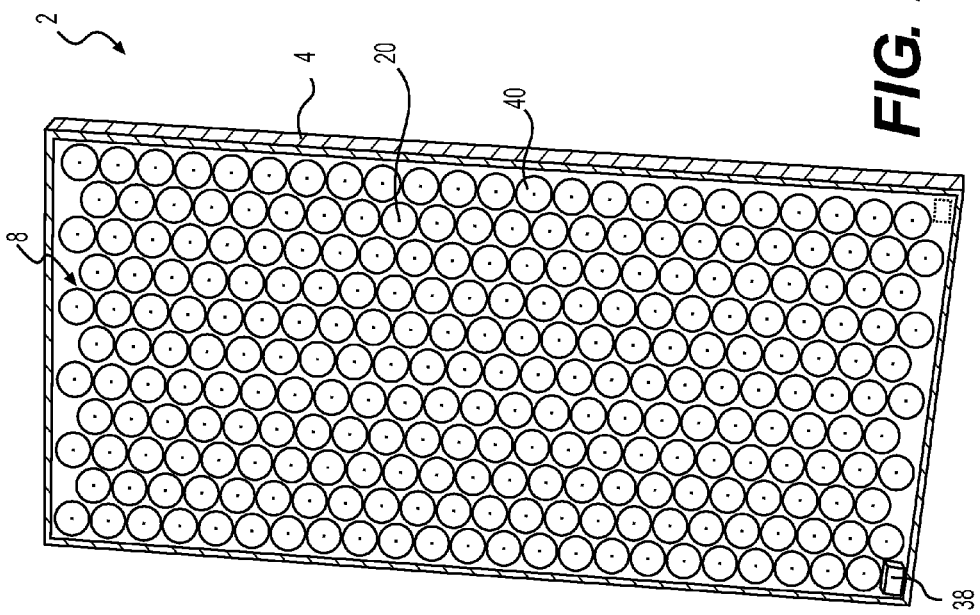
FIG. 2 is a rear perspective view of an embodiment of a concentrated photovoltaic panel.
Figure 1:
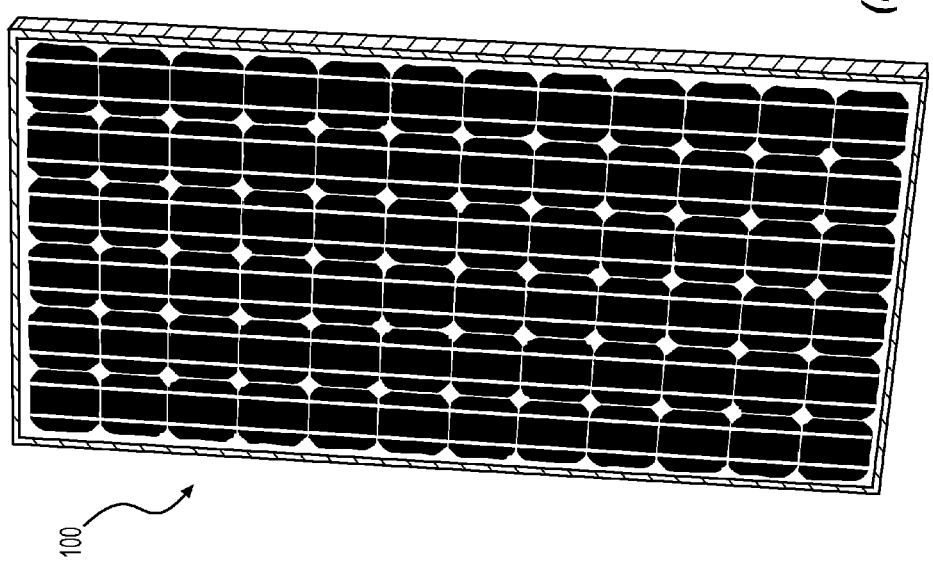
FIG. 1 is a perspective view of a conventional (prior art) photovoltaic panel.

FIG. 2 is a rear perspective view of an embodiment of a concentrated photovoltaic (CPV) panel 2. The CPV panel 2 has a receiver substrate assembly 10, one or more light-guide optics 40 attached to the receiver substrate assembly 10, optionally, one or more focusing optics 50 (shown in FIG. 3) attached to the receiver substrate assembly 10 (collectively referred to herein as "CPV panel apparatus" 6), a panel frame 4 and a junction box 38. The CPV panel 2 may be made to have dimensions similar to those of a conventional non-concentrating photovoltaic panel 100, such as that shown in FIG. 1, and thereby serve as a replacement product in suitable deployments (e.g., may replace conventional photovoltaic panels mounted on a tracker).

The receiver substrate assembly 10 includes a rigid sheet 12 of light transmissive material with a conductor pattern 30 and at least one receiver assembly 20 affixed thereto. The rigid sheet 12 has a first surface 14 and a second surface 16 opposite the first surface 14. Each receiver assembly 20 is attached to the first surface 14 of the rigid sheet 12 and electrically connected to the conductor pattern 30. For example, each receiver assembly 20 can be bonded to the rigid sheet 12 at bond sites 26 with a conductive epoxy, which can allow attachment to the rigid sheet 12 and electrical connection to the conductor pattern 30 in a single step during assembly. Alternatively, positive and negative contacts of each receiver assembly 20 may be soldered to the conductor pattern 30. In yet other embodiments, one of the positive or negative contacts of each receiver assembly 20 may be soldered to or bonded with a conductive epoxy to the conductor pattern 30 while the other contact is electrically connected to the conductor pattern 30 by wire bonding, spring clipping or any other means known in the art.

Figure 4:
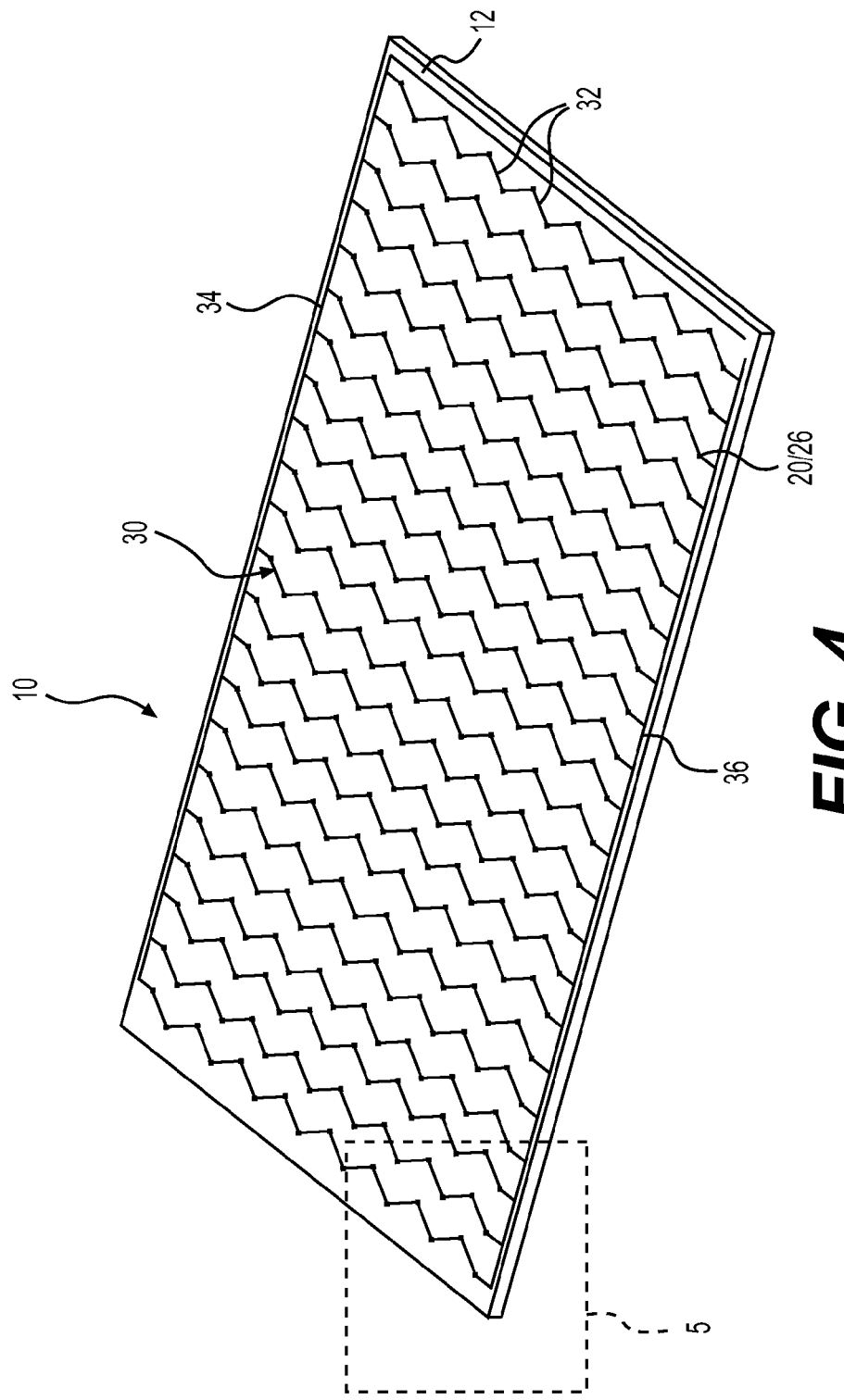
FIG. 4 is a plan view of an embodiment of a receiver substrate assembly.
Figure 5:
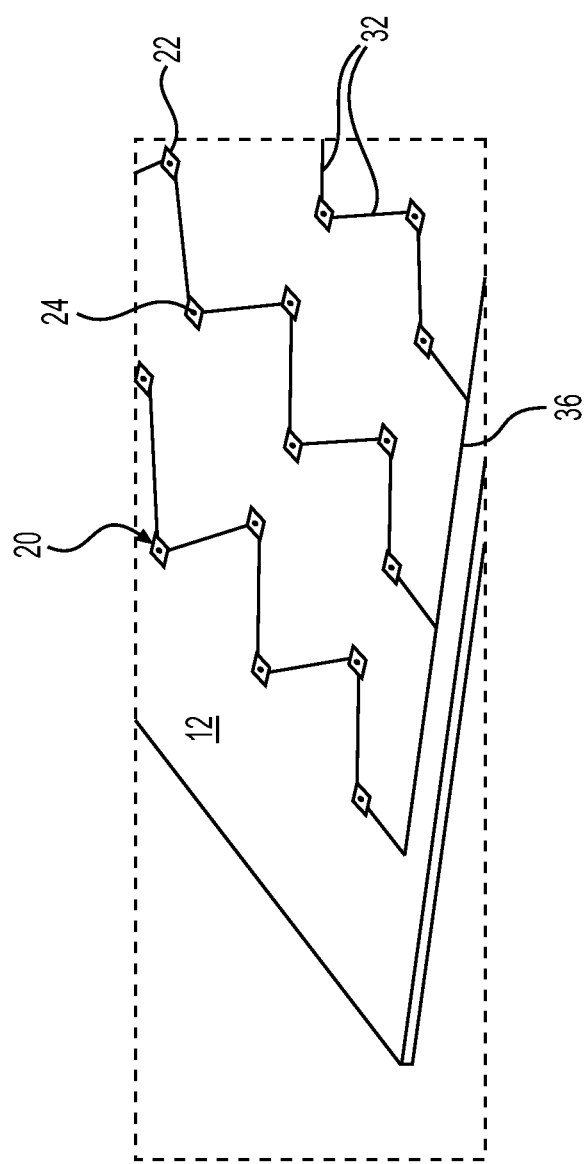
FIG. 5 is a detail view of a portion of the receiver substrate assembly of FIG. 4.
Figure 6:
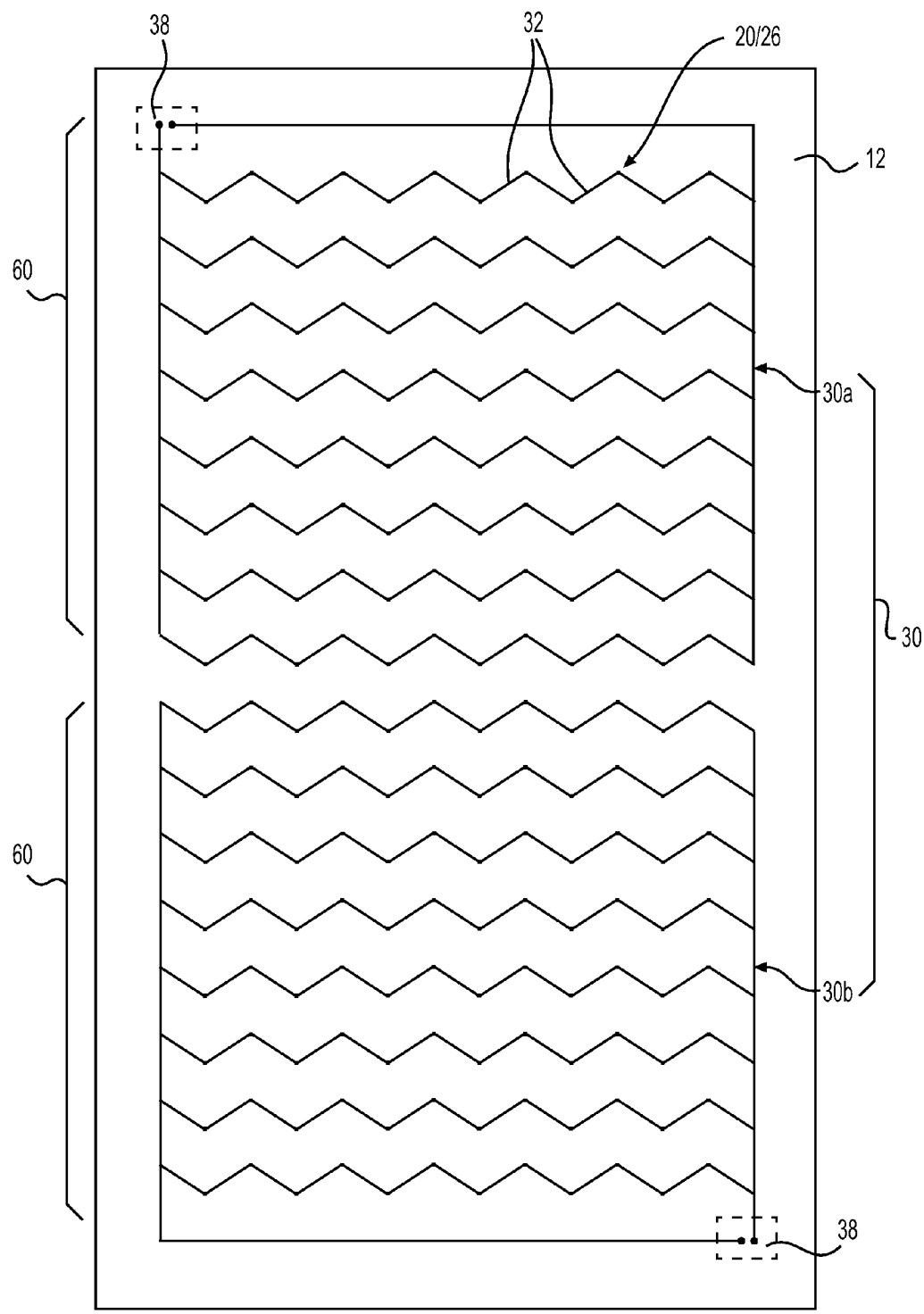
FIG. 6 is a rear plan view of an alternate embodiment of a receiver substrate assembly having two arrays of receiver assemblies.

The conductor pattern 30 provides electrical paths between the receiver assemblies 20 and the junction box 38. In the embodiment illustrated in FIGS. 3, 4 & 5, the conductor pattern 30 includes a positive bus bar 34, a negative bus bar 36 and a plurality of interconnection traces 32 which connect, directly or indirectly, each receiver assembly 20 to the bus bars 34, 36. In the embodiment of FIG. 4, the conductor pattern 30 electrically connects 22 strings of 16 series-connected receiver assemblies 20 in parallel. In other embodiments, the conductor pattern 30 can be designed to provide electrical paths for two or more arrays 60 of receiver assemblies 20. As shown in FIG. 6, the conductor pattern 30 can comprise two halves 30a, 30b, each of which provide electrical paths for an array 60 of receiver assemblies 20 to a junction box 38. As will be appreciated by a person skilled in the art, patterns other than those shown and/or described herein may be used to suit specific applications.

The conductor pattern 30 is formed of an electrically conductive metal such as silver or copper. The conductor pattern 30 can be applied onto the first surface 14 of the rigid sheet 12 by any suitable metalization process, which could, for example, include sputtering, galvanizing or screen printing a thick film. Alternatively, conductors, such as wires, ribbons and/or foils, can be attached to the rigid sheet 12 using a bonding agent such as epoxy and/or by soldering the conductors to metalizations on the rigid sheet 12 (e.g., metalized dots).

Unlike conventional solar concentrators, the conductor pattern 30 is sandwiched between the rigid sheet 12 and either a light guide optic 40 or a focusing optic 50.

The conductor pattern 30 may also serve as a heat spreader by spreading the heat generated at the photovoltaic cell 24 away from the photovoltaic cell 24 to be dissipated through the rigid sheet 12 and the light guide optic 40. Where the optical units 8 (comprising the light guide optic 40, the photovoltaic cell 24 and, where present, the focusing optic 50) are sufficiently small, the interconnection traces 32 of the conductor pattern 30 may be capable of dissipating heat from the photovoltaic cell 24 fast enough to keep the photovoltaic cell 24 cool enough to operate efficiently. However, for larger optical units 8, the interconnection traces 32 may be insufficient for cooling the photovoltaic cell 24. More elaborate conductor patterns 30 that have heat spreader portions 70 electrically and thermally connected to the interconnection traces 32 may therefore be employed to cool larger optical units 8. The larger the optical unit 8, the greater the surface area of the conductor pattern 30 required.

Figure 7A:
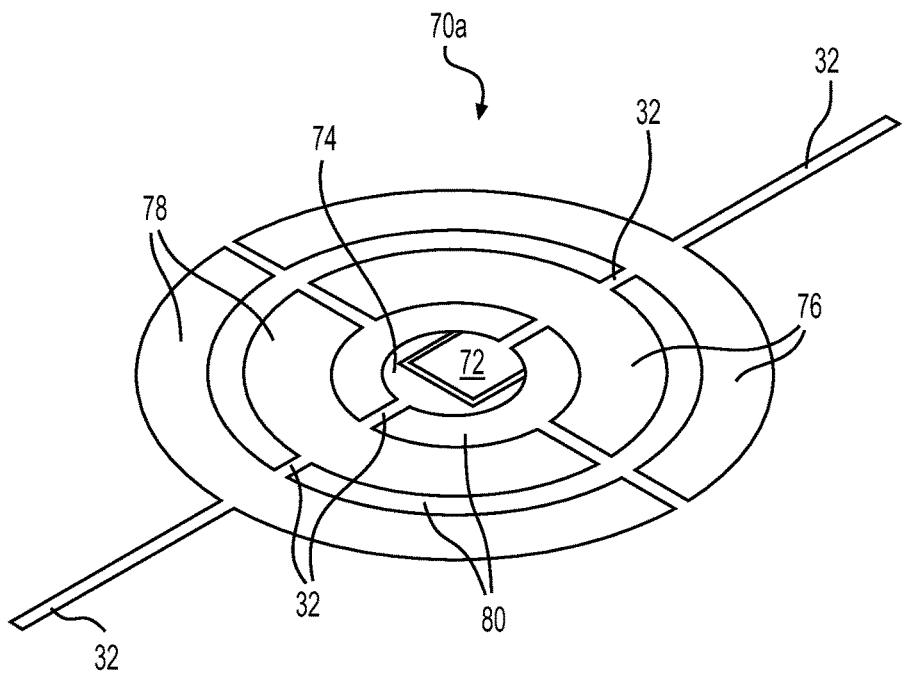
FIG. 7A is a perspective view of an embodiment of a heat spreader portion of a receiver substrate assembly.
Figure 7B:
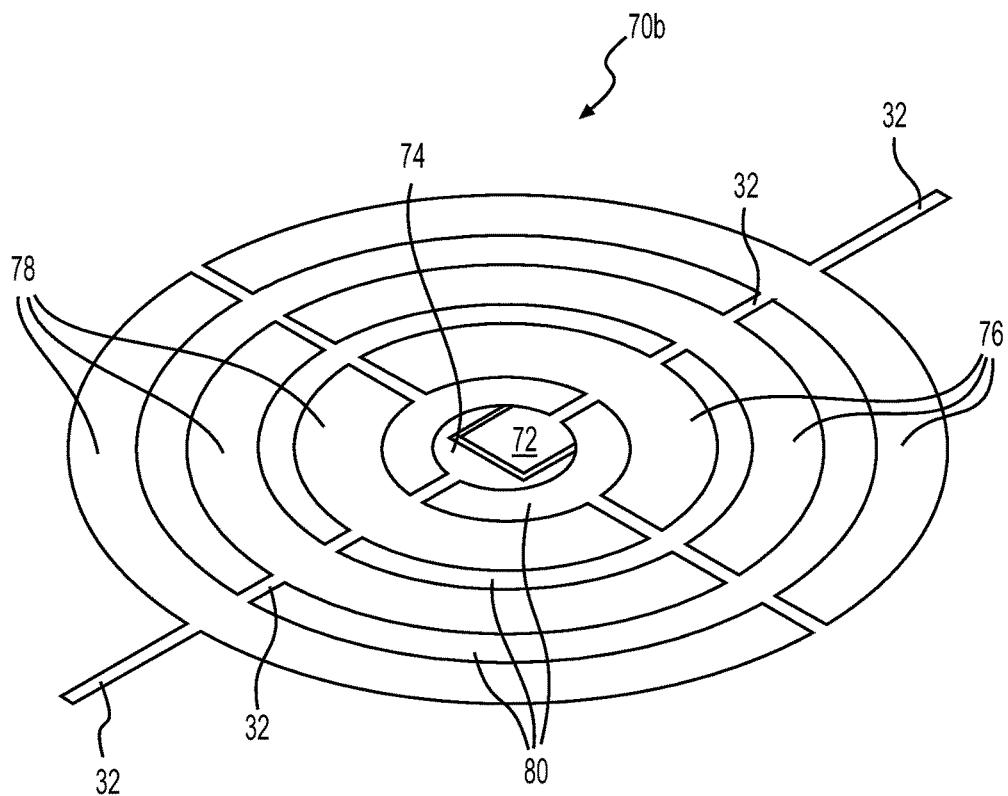
FIG. 7B is a perspective view of another embodiment of a heat spreader portion of a receiver substrate assembly.

FIGS. 7A & 7B show substantially flat heat spreader portions 70a, 70b of conductor pattern 30. The heat spreader portion 70a has a positive half and a negative half. The positive half includes a positive terminus 72, positive arms 76 and interconnection traces 32 electrically and thermally connecting the positive terminus 72 and the positive arms 76. The negative half includes a negative terminus 74, negative arms 78 and interconnection traces 32 electrically and thermally connecting the negative terminus 74 and the negative arms 78. The positive terminus 72 is disposed proximate to the negative terminus 74 to allow their connection (e.g., by soldering) with the positive and negative contacts of the receiver assembly 20. The interconnection traces 32 extending from the heat spreader portion 70a electrically connect the positive half of one heat spreader portion 70a to the negative half of the next heat spreader trace 70a of the string or a bus bar 34, 36. Gaps 80 are provided between arms 76, 78 to facilitate heat dissipation and to allow light to be focused therethrough by the focusing optic 50 into the light guide optic 40. The heat spreader portion 70a is designed to allow light to be transmitted from the focusing optic 50 to the light guide optic 40 with little shading. The heat spreader portion 70a illustrated in FIG. 7A allows light from concentric lenses (e.g., toroidal lenses) of a focusing optic 50 to pass through gaps 80, through the rigid sheet 12 and into the light guide optic 40, shaded only by the interconnection traces 32. The heat spreader portion 70b can be scaled to accommodate larger optical units 8 by increasing the number of positive and negative arms 76, 78, as shown in FIG. 7B. Such heat spreader portions 70a, 70b can be metalized onto the rigid sheet 12 or stamped from a sheet or foil of conductive material (commonly used in the fabrication of circuit boards) such as conductive metals (e.g., copper, gold or aluminum) and polymers loaded with conductive materials and bonded to the rigid sheet 12.

Figure 8A:
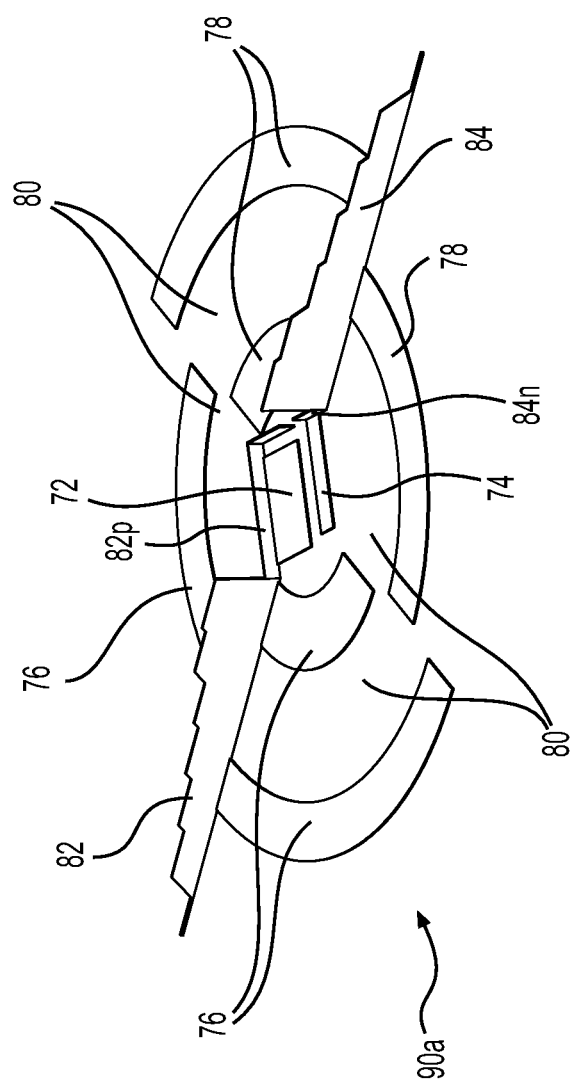
FIG. 8A is a perspective view of another embodiment of a heat spreader portion of a receiver substrate assembly.
Figure 8B:
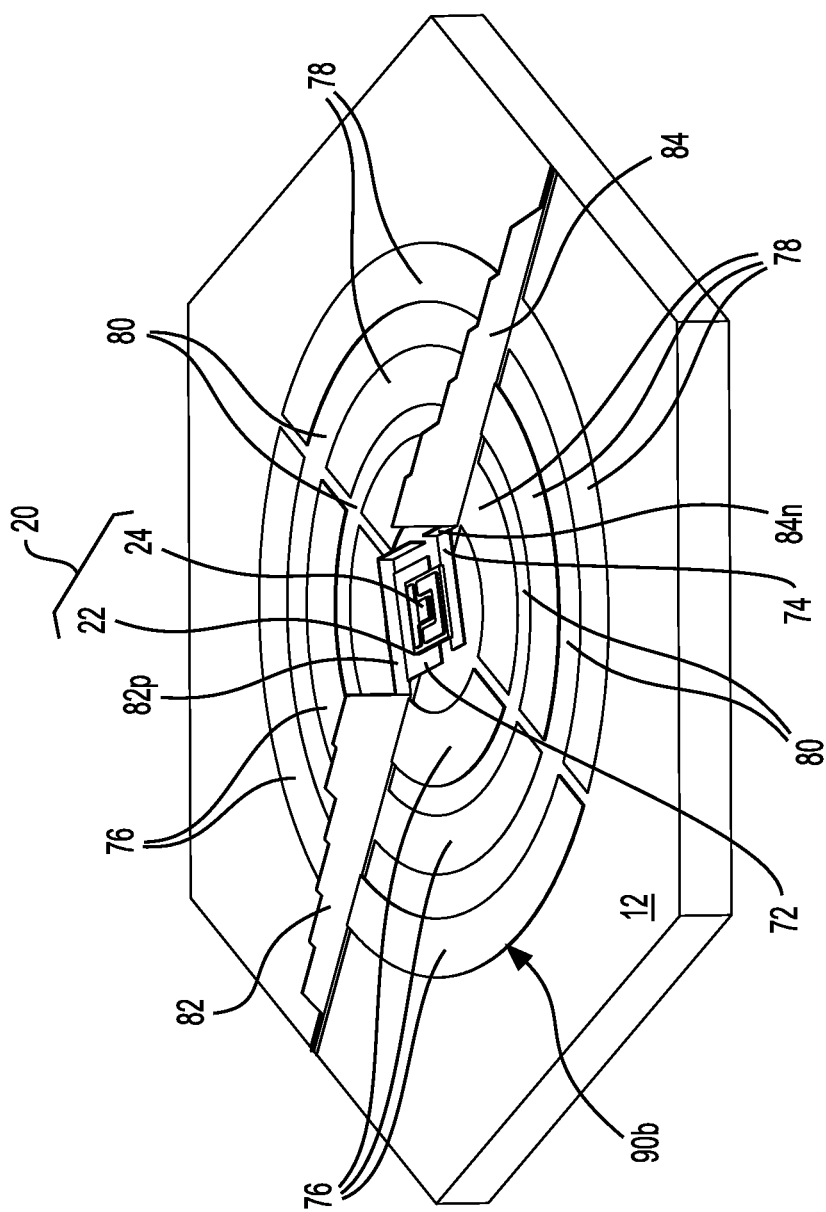
FIG. 8b is a perspective view of a cell receiver assembly including the heat spreader portion of FIG. 8A.
Figure 8C:
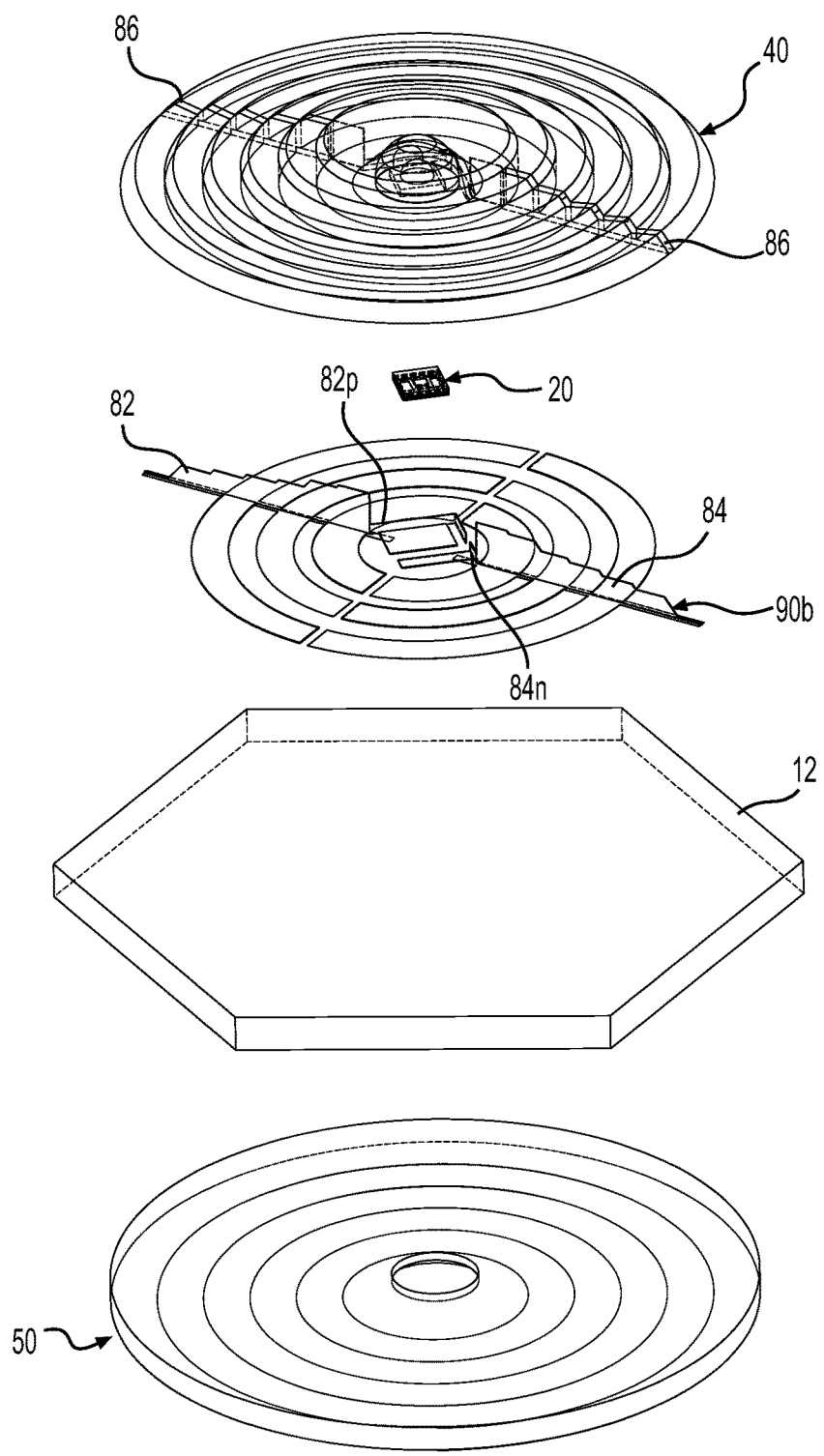
FIG. 8C is an exploded view of an embodiment of an optical unit including the heat spreader portion of FIG. 8A.

In another embodiment, the heat spreader portion 70 may have one or more fins 82, 84 extending outwardly from the first surface 14 of the rigid sheet 12. FIGS. 8A-8C show a heat spreader portion 90a, 90b that has positive arms 76, negative arms 78, a positive terminus 72 and a negative terminus 74, all of which lie flat against the rigid sheet. These portions the lie flat against the rigid sheet 12 can be metalized onto the rigid sheet 12 or can be attached to the rigid sheet 12 with an adhesive or soldered to metalizations on the rigid sheet 12. The heat spreader portion further has a positive fin 82 and a negative fin 84, which, in the illustrated embodiment, are attached to and extend perpendicularly from those portions that lie flat against the rigid sheet 12.

The heat spreader portion 90a shown in FIG. 8A can be stamped for a single sheet of conductive material and bent or folded to form the functional heat spreader portion 90a. Alternatively, each of the positive half and the negative half of the heat spreader portion 90a can be integrally formed, for example, by 3D printing onto the rigid sheet 12 or molding each half of the heat spreader portion 90a and attaching it to the rigid sheet 12 with an adhesive or by soldering to metalizations on the rigid sheet 12.

In the embodiment of FIG. 8B, the positive arms 76 and negative arms 78 of the heat spreader portion 90b are more densely packed thereby increasing the surface area over which heat can be dissipated. FIG. 8B also illustrates how the positive arms 76, negative arms 78, positive terminus 72 and negative terminus 74 lie flat against the rigid sheet 12 and the positive fin 82 and negative fin 84 extend perpendicularly from those portions that lie flat against the rigid sheet 12. This heat spreader portion 90b cannot be stamped from a single sheet of conductive material. Instead the parts that lie flat against the rigid sheet 12 can be metalized onto the rigid sheet 12 or stamped from a sheet of conductive material or otherwise formed and bonded to the rigid sheet 12, while the positive and negative fins 82, 84 must be separately stamped from a sheet of conductive material or otherwise formed and be soldered or attached to those portions that lie flat against the rigid sheet 12 with an electrically and thermally conductive adhesive. Alternatively, each of the positive half and the negative half of the heat spreader portion 90b can be integrally formed, for example, by 3D printing onto the rigid sheet 12 or molding each half of the heat spreader portion 90b and attaching it to the rigid sheet 12. As shown in FIG. 8B the receiver assembly 20 can be mounted across the positive terminus 72 and the negative terminus 74 for connection with the positive terminus 72 and the negative terminus 74. The positive fin 82 and the negative fin 84 can have bent portions 82p, 84n to accommodate the receiver assembly 20. The bent portions 82p, 82n should have a height from the rigid sheet that is short enough not to impede the transmission of light from the light guide optic 40 to the photovoltaic cell 24. The positive fin 82 electrically and thermally interconnect the positive arms 76 and the positive terminus 72. Similarly, the negative fin 84 electrically and thermally interconnect the negative arms 78 and the negative terminus 74. As shown in FIG. 8C, the light guide optic 40 can be provided with a groove 86 to accommodate the fins 82, 84. Use of such fins 82, 84 may reduce shading while increasing the surface area for dissipation of heat, and facilitate alignment of the light guide optic 40 with the receiver assembly 20 and thereby the photovoltaic cell 24.

The conductor pattern 30 can additionally or alternatively serve as and/or include alignment markers to facilitate assembly of the CPV panel apparatus 6. Alignment markers could, for example, be metalized dots (not shown). Alignment markers could, for example, facilitate the location of bond sites 26 for dispensing of a bonding agent for attachment of the receiver assemblies 20 to the rigid sheet 12 and placement of the receiver assemblies 20 on the rigid sheet 12. Alignment markers could also facilitate alignment of the light-guide optic 40 and the receiver assembly 20 (more particularly, the photovoltaic cell 24) of each optical unit 8. Where the optical unit 8 includes a focusing optic 50 for insertion of light into the light-guide optic 40 to be guided thereby toward the photovoltaic cell 24, alignment markers could facilitate alignment of the focusing optic 50 with the light guide optic 40.

Each receiver assembly 20 includes a photovoltaic cell 24 for conversion of concentrated sunlight into electricity. Each photovoltaic cell 24 can be mounted on a receiver substrate 22 of the receiver assembly 20 and is in electrical communication with the conductor pattern 30.

The photovoltaic cell 24 can be a high efficiency photovoltaic cell, such as a multi-junction solar cell. For example, the photovoltaic cell 24 can be a GaInP/GaInAs/Ge III-V triple-junction solar cell.

The receiver assembly 20 can also include a bypass diode (not shown) to prevent the failure of a string of receiver assemblies 20 connected in series due to failure, shading or any other issues that would cause one of the series connected receiver assemblies 20 to enter an open circuit state. Alternatively, the bypass diode may be separate from the receiver assembly 20 and may be electrically connected directly to the interconnection traces 32 (e.g., by soldering the bypass diode to each end of a discontinuity in the interconnection traces).

The receiver substrate 22 provides a medium on which electrical connections can be made between the electrical components of the receiver assembly 20, including the photovoltaic cell 24 and, if present, the bypass diode, and the conductor pattern 30. Electrical components of the receiver assembly 20 may be soldered to conductors on the receiver substrate 22 to form electrical connections. The receiver substrate 22 can be a surface mount substrate with positive and negative contacts on the backside of the substrate (i.e., the surface of the substrate opposite that on which the photovoltaic cell 24 is mounted) for electrical connection to the conductor pattern 30.

The light guide optics 40 are made of a light transmissive material and guide light received via the rigid sheet 12 substantially laterally toward their associated photovoltaic cells 24. Each light guide optic 40 has a central axis and rotational symmetry about the central axis 44. Light is guided by the light-guide optics 40 by at least one reflection on at least one reflective surface 42. The at least one reflection on the at least one reflective surface 42 can be total internal reflections on surfaces that interface with materials having a lower index of refraction than the light-guide optics 40, reflections on mirror coated surfaces of the light-guide optics 40 or a combination thereof. The one or more reflective surfaces 42 can form concentric rings about the central axis 44, an example of which is shown in FIG. 3.

Each focusing optic 50 is made of a light transmissive material and directs light towards one or more reflective surfaces 42 of an associated light-guide optic 40. Use of focusing optics 50 may therefore allow for thinner CPV panel apparatus 6 than would otherwise be possible.

Non-limiting examples of light transmissive materials that may be used to form the rigid sheet 12, the light guide optics 40 and/or the focusing optics 50 include glass, light transmissive polymeric materials such as rigid, injection molded poly(methyl methacrylate) (PMMA), polymethyl methacrylimide (PMMI), polycarbonates, cyclo olefin polymers (COP), cyclo olefin copolymers (COC), polytetrafluoroethylene (PTFE), or a combination of these materials. For example, the rigid sheet 12 can be a sheet of glass, and the light guide optics 40 and the focusing optics 50 can be made of PMMA. Alternatively, the light guide optics 40 and/or the focusing optics 50 can be made of a silicone rubber such as silicone having hardness, when cured, of at least 20 Shore A. Attachment of each light-guide optic 40 and focusing optic 50 to the receiver substrate assembly 10 can be achieved by optically bonding the optics 40, 50 to the receiver substrate assembly 10 with an optical bonding agent, laser welding (where the rigid sheet 12 and the light-guide optics 40 and focusing optics are made of polymers) or any other means known in the art. As an example, if the light guide optics 40 and the focusing optics 50 are made of a polymeric material, they can be optically bonded to the glass rigid sheet 12 using an optical adhesive such as a silicone. Alternatively, the light guide optics 40 and the focusing optics 50 can be 3D printed directly on the glass rigid sheet 12 or the surfaces of the receiver substrate assembly 10 can be coated with a polymer, such as a silicone rubber, and the polymeric light guide optics 40 and focusing optics 50 can be 3D printed thereon.

Figure 3:
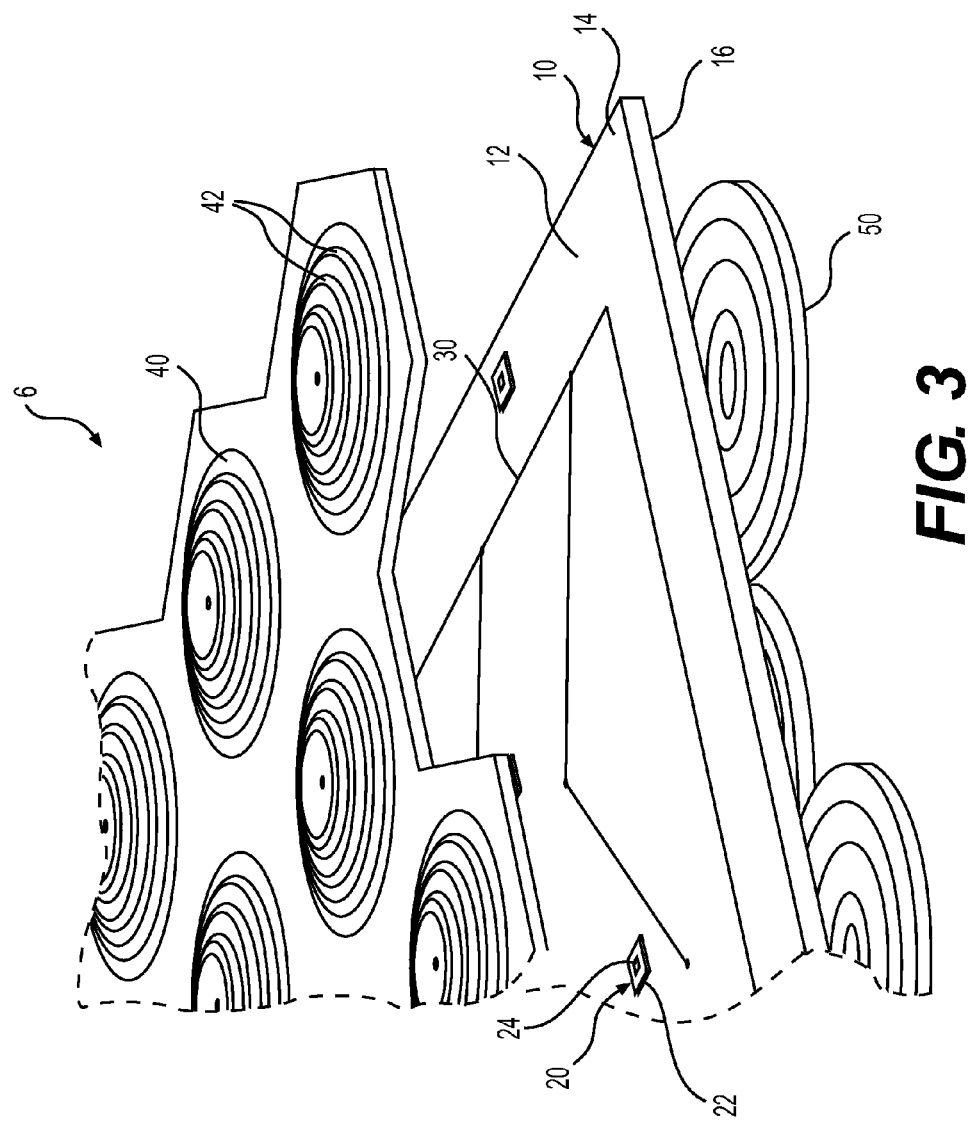
FIG. 3 is an exploded perspective view of the concentrated photovoltaic panel apparatus of the concentrated photovoltaic panel of FIG. 2.

Although FIGS. 2 and 3 show circular light guide optics 40 and circular focusing optics 50, the light guide optics 40 and/or the focusing optics 50 can be cropped into a tileable shape such as a square or a hexagon to eliminate dead space between optical units 8.

Figure 9:
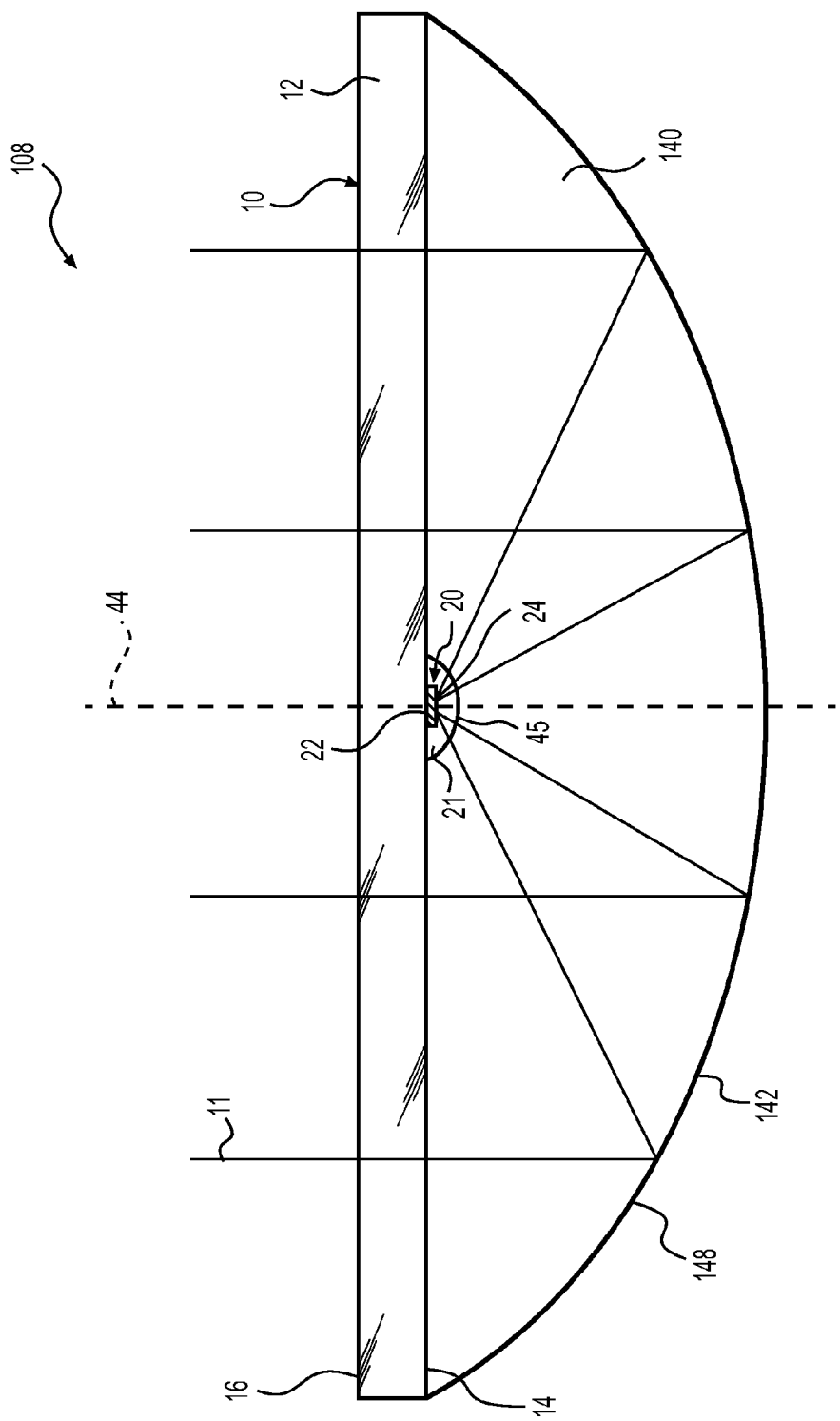
FIG. 9 is a cross-sectional view of an embodiment of an optical unit that has a curved light guide optic.

FIG. 9 is a cross sectional view of an optical unit 108 having a parabolic light guide optic 140 optically bonded to the first surface 14 of a receiver substrate assembly 10. In this embodiment, light 11, typically from the sun, impinges on the rigid sheet 12 at an angle substantially normal to the second surface 16. The light 11 is transmitted through the rigid sheet 12, exiting through the first surface 14 into the light guide optic 140. The reflective surface 142 can be parabolic in shape and have a mirror coating 148 to reflect the light impinging thereon towards the focus of the parabola where a photovoltaic cell 24 can be placed to convert the light 11 into electricity. Non-limiting examples of materials that can be used for the mirror coating 148 are metals such as aluminum or silver, or a dielectric.

In some embodiments a cell envelope 21 may surround the photovoltaic cell 24, which is typically the hottest portion of an optical unit 108, and serve as thermal insulation to protect the physical integrity of the materials of the light guide optic 40. Where the receiver assembly 20 is attached to a rigid sheet 12 made of glass, and the light guide optic is made of a polymer such as PMMA, it may only be necessary to provide a cell envelope 21 about the photovoltaic cell 24 on the side facing the light guide optic 40. The cell envelope 21 can be a dome (e.g., a hemisphere) of thermally insulating material, e.g., a polymer such as silicone or glass. The light guide optic 40 can therefore include a cavity 45 complementary in shape to the cell envelope 21 to house the cell envelope 21. Alternatively, the cell envelope 21 may be filled with a gas such as air contained by the cavity 45. An example of a cell envelope 21 and cavity 45, to thermally insulate the light guide optic 140 from heat generated at the photovoltaic cell 24, is shown in FIG. 9.

Figure 10:
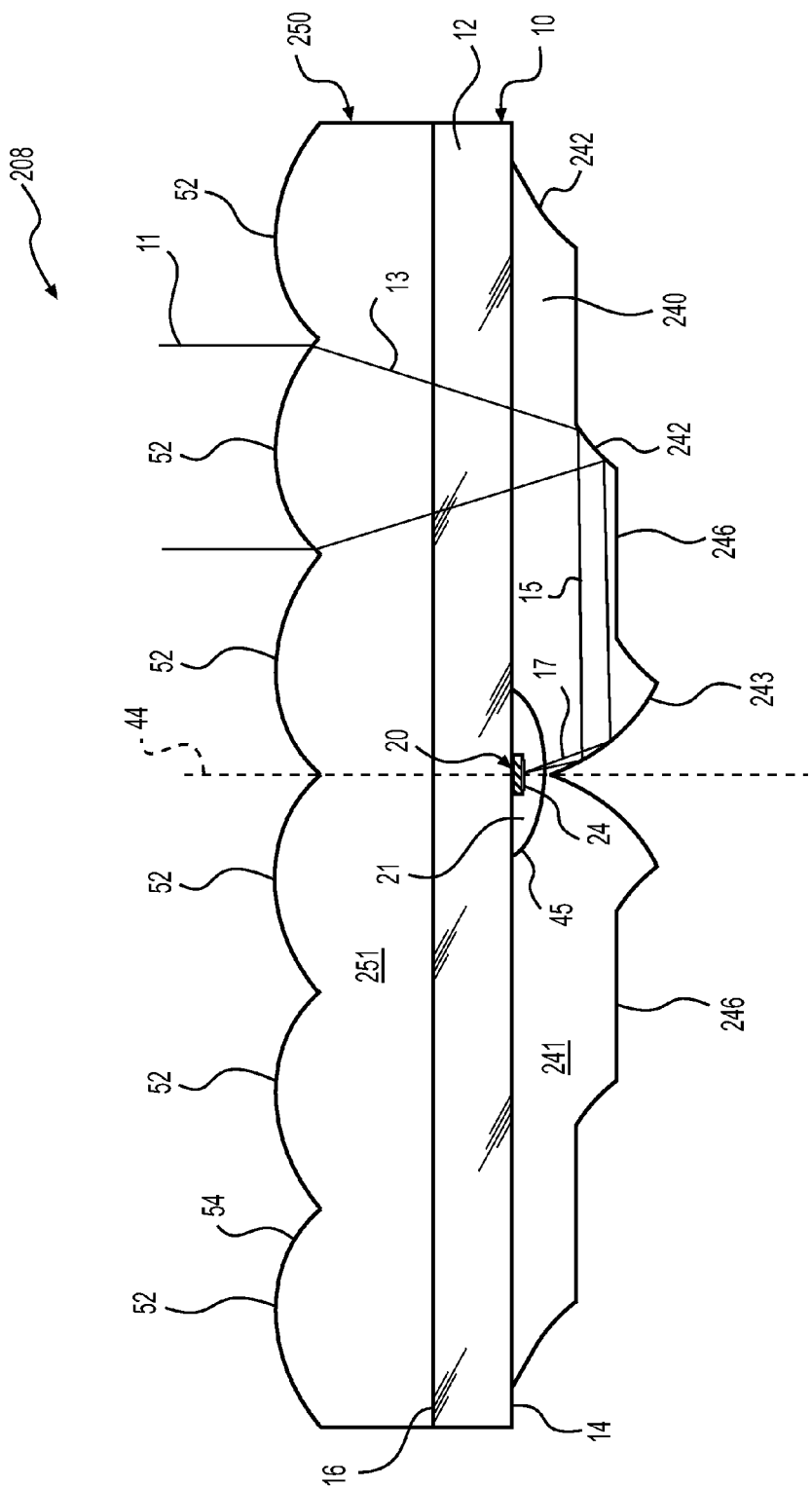
FIG. 10 is a cross-sectional view of an embodiment of an optical unit that has a focusing optic and a light guide optic, and the focusing optic reflects light directly to a conditioning surface.

FIG. 10 is a cross sectional view of an optical unit 208 including a focusing optic 250 optically bonded to the second surface 16 of a receiver substrate assembly 10, and a light guide optic 240 optically bonded to the first surface 14 of the receiver substrate assembly 10. In this embodiment, the focusing optic 250 is formed of a plurality of lenses adjacent to one another and has rotational symmetry about the central axis 44. The lenses 52 can therefore form concentric rings about the central axis 44. Although FIG. 10 shows a focusing optic 250 with three lenses 52 on either side of the central axis 44, greater or fewer lenses may be used depending on the dimensions of the optical unit 8 and the materials used.

The light guide optic 240 is stepped and substantially wedge-shaped in cross section, having a plurality of reflective surfaces 242 separated by step surfaces 246. A reflective surface 242 is positioned near the focus of each lens 52, such that substantially all of the sunlight 11 impinging upon the surface 54 of a lens 52 is focused by the lens 52 toward the reflective surface 242. The focused light 13 is transmitted through the light transmissive body 251 of the focusing optic 250, through the rigid sheet 12 and through the light transmissive body 241 of the light guide optic 240 to the reflective surfaces 246. Where the conductor pattern 30 includes heat spreader portions (not shown) the lenses 52 focus the light 13 through the gaps 80 of the heat spreader portions 70a, 70b, 90a, 90b. The focused light 13 may be reflected by the reflective surfaces 242 by total internal reflection or, where the reflective surfaces 242 are mirror coated, by specular reflection. The reflected light 15 is transmitted in the light transmissive body 241 of the light guide optic 240 towards a conditioning surface 243, which may be a parabolic section in cross section and which reflects the reflected light 15 towards the photovoltaic cell 24. The reflected light 15 may be reflected by the conditioning surface 243 by total internal reflection, or where the conditioning surface 242 is mirror coated, by specular reflection. The path of the concentrated light 17, which has been reflected by the conditioning surface 243, is focused towards the focus of the parabola but intercepted by the photovoltaic cell 24 which converts the concentrated light 17 into electricity.

Figure 11:
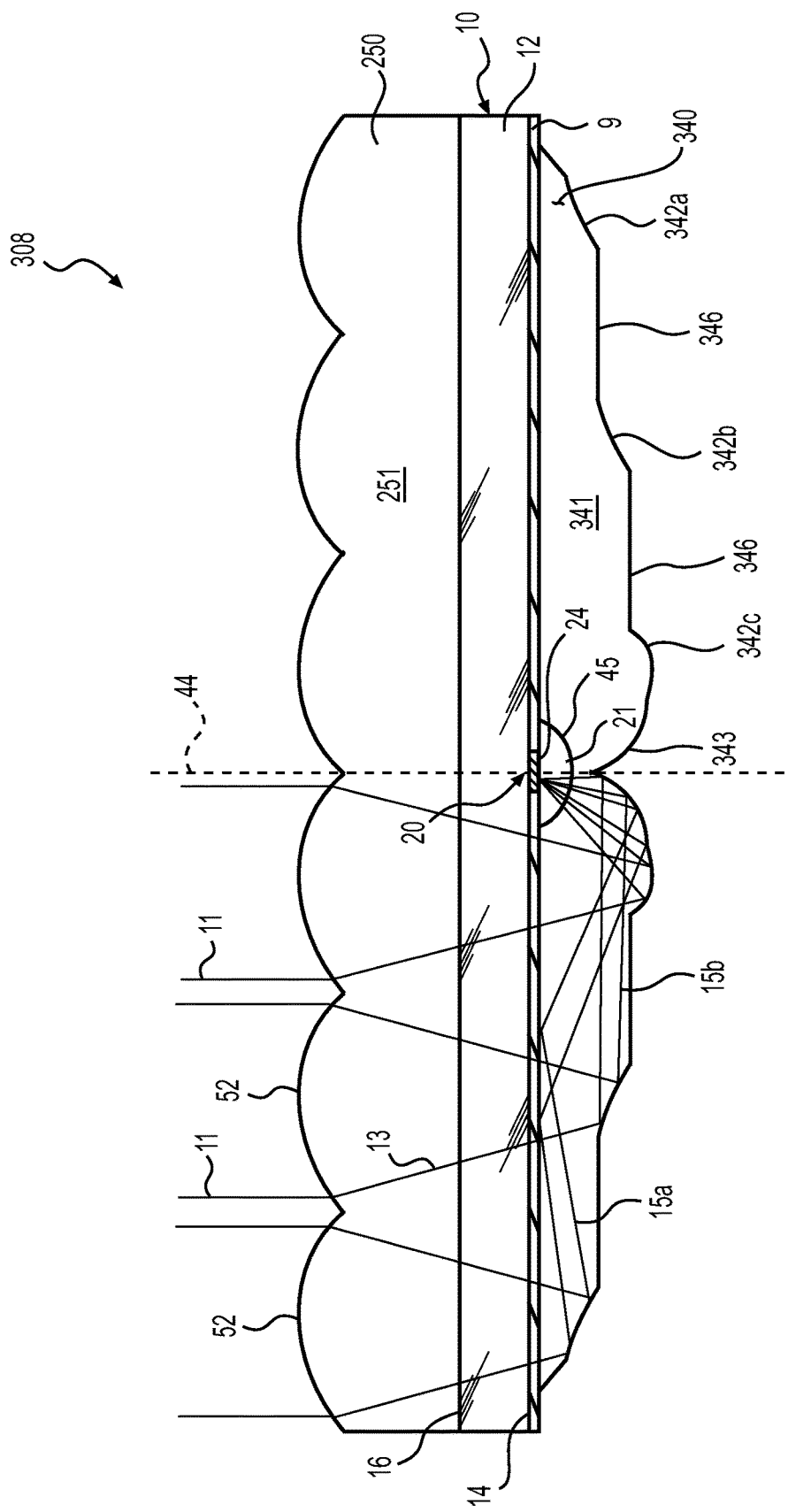
FIG. 11 a cross-sectional view of an embodiment of an optical unit in which the light guide optic has reflecting surfaces that reflect light in three different paths.
Figure 12:
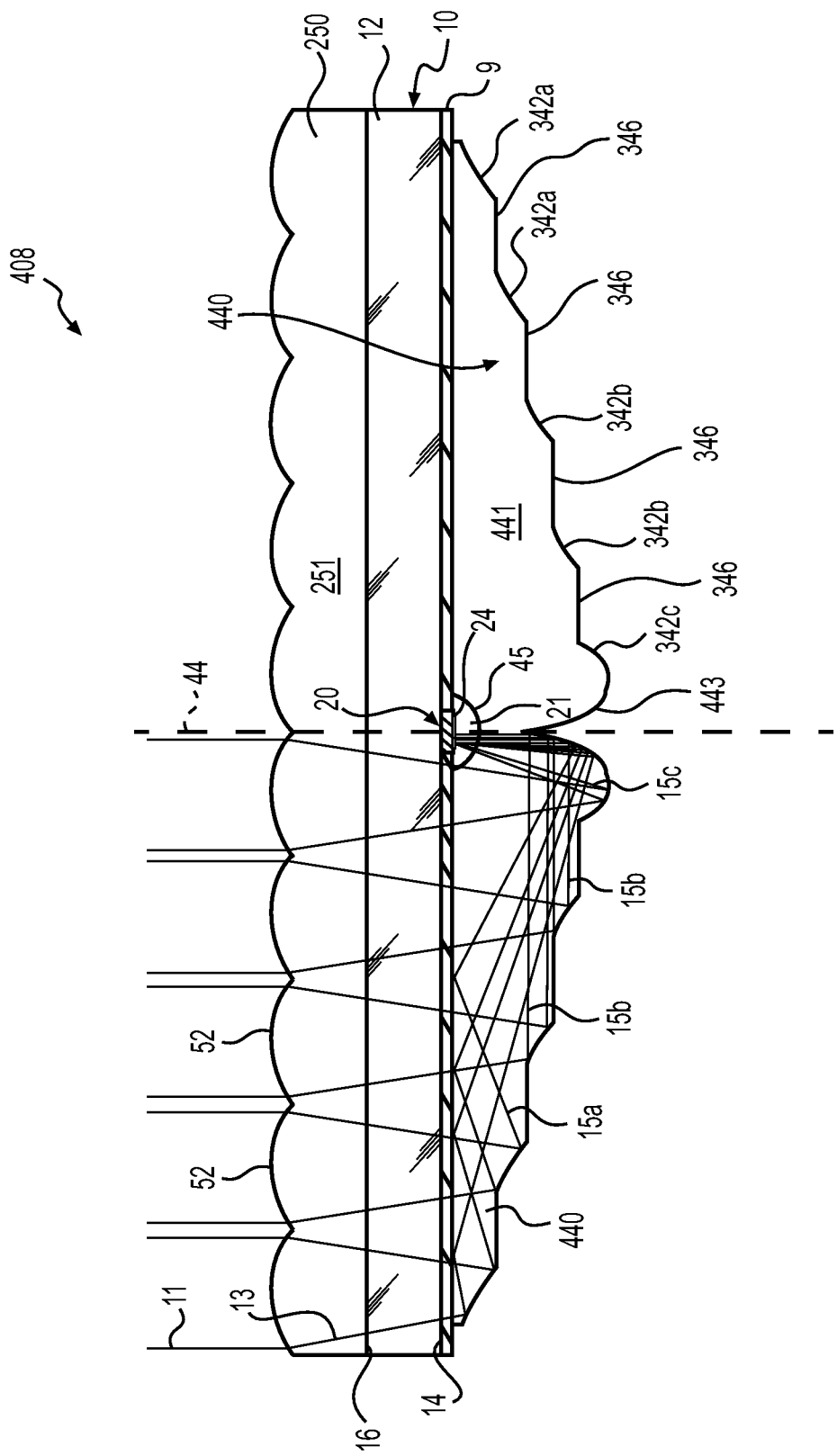
FIG. 12 a cross-sectional view of another embodiment of an optical unit in which the light guide optic has reflecting surfaces that reflect light in three different paths.

In embodiments having multiple reflective surfaces 242, each reflective surface 242 may be identical to the others such that substantially all of the light in the optical unit 208 is generally transmitted in the same direction toward the conditioning surface 243, i.e., the light may be collimated as shown in FIG. 10. Alternatively, the reflective surfaces 242 may be different from one another, such that a reflective surface or a group of reflective surfaces reflect light in one direction, and another reflective surface or another group of reflective surfaces reflect light in another direction or directions As shown in FIGS. 11 and 12, an optical unit 308, 408 can include a focusing optic 250, a receiver substrate assembly 10, a low index film 9 and a light guide optic 340, 440. The low index film 9 has a lower index of refraction than the light transmissive body 341, 441. An example of a low index film material is a layer of a low index polymer or polytetrafluoroethylene (Teflon), which can be deposited onto the first surface 14 of the rigid sheet 12. The focused light 13 is transmitted through the light transmissive body 251 of the focusing optic 250, through the rigid sheet 12, through the low index film 9 and through the light transmissive body 341, 441 and onto the reflective surfaces 342a, 342b, 342c.

In this embodiment, the reflective surfaces 342a intercept the focused light 13 and reflect it, such that the reflected light 15a is transmitted through the light transmissive body 341,441 of the light guide optic 340,440 towards the low index film 9. The reflected light 15a is then reflected a second time by the low index film 9 via total internal reflection (TIR) and is transmitted towards a conditioning surface 343, 443. Reflective surfaces 324b intercept the focused light 13 and reflect it directly towards the conditioning surface 343, 442. The conditioning surface 343, 443 reflects the reflected light 15a, 15b towards the photovoltaic cell 24 for harvesting electricity. Reflective surfaces 342c reflect the focused light 13 directly towards the photovoltaic cell 24. In these embodiments, the reflective surfaces 342a-342c are separated by step surfaces 346. FIG. 11 shows an optical unit 308 wherein each reflective surface 342a, 342b, 342c has a different profile in cross section. FIG. 12 shows an optical unit 308 having a group of two reflective surfaces 342a, a group of two reflective surfaces 342b and a reflective surface 342c. In an alternative embodiment similar to that of FIG. 12, any number of reflective surfaces 342a, 342b, 342c and corresponding lenses 52 may be included.

Figure 13:
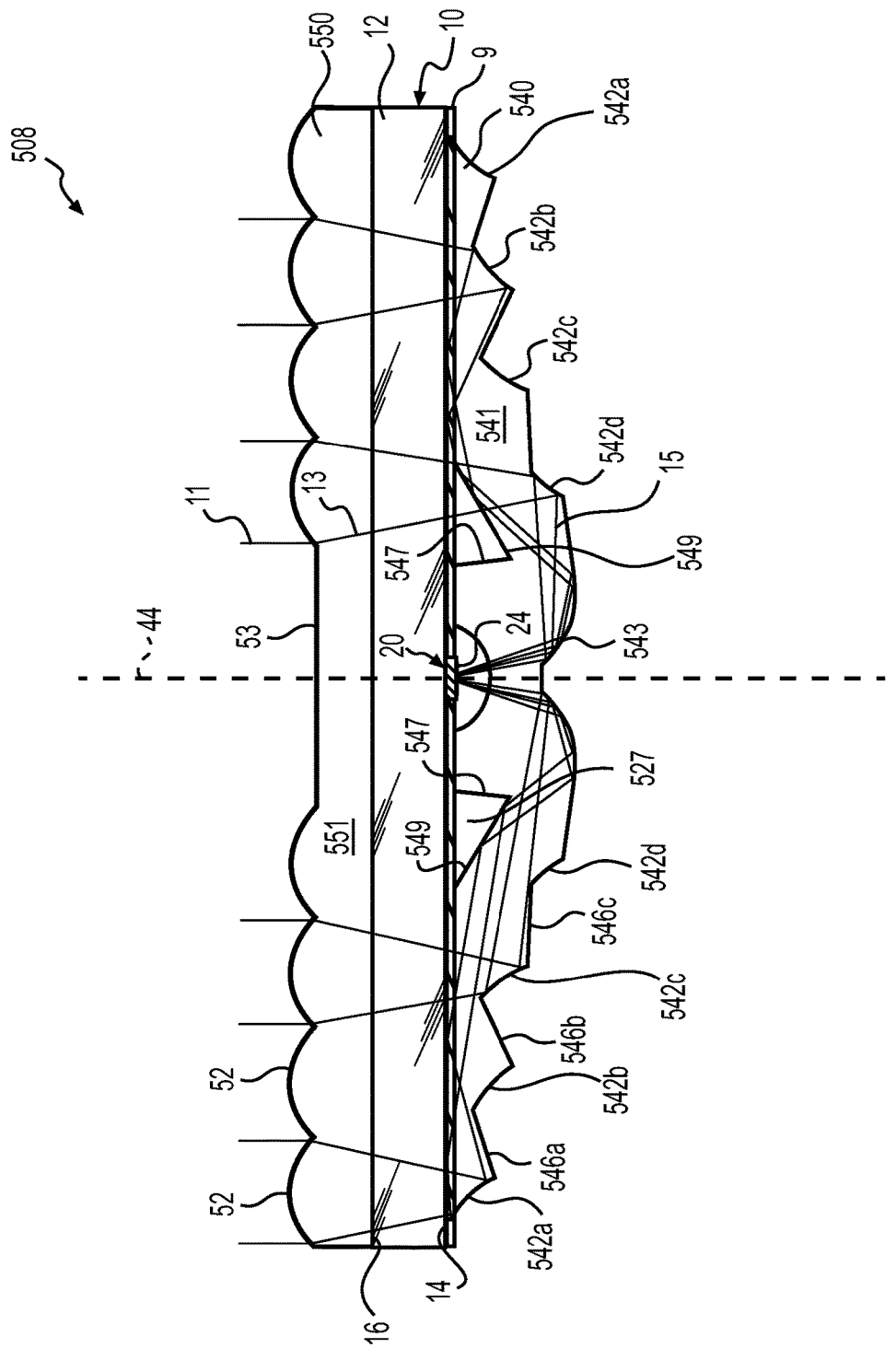
FIG. 13 is a cross-sectional view of an embodiment of an optical unit where the light guide optic includes tertiary reflectors.

FIG. 13 shows a cross section of an optical unit 508 in which the light guide optic 540 includes a plurality of reflective surfaces 542a-542d, each reflective surface 542a-542d having a different profile in cross section from the others, separated by a plurality of step surfaces 546a-546c each step surface 546a-546c having a different profile in cross section from the others. The light guide optic 540 also includes tertiary reflector 547 with a secondary reflective surface 549. The gap 527 between the low index film 9 and the tertiary reflector 547 can be filled with a gas such as air or any suitable light transmissive material having a lower refractive index than the light transmissive body 541 of the light guide optic 540. The secondary reflective surfaces 549 can be mirror coated or they can reflect light by TIR.

Reflective surfaces 542a and 542b intercept the focused light 13 and reflect it towards the low index film 9, which further reflects the reflected light 15 towards a secondary reflective surface 549. The secondary reflective surface 549 then reflects the reflected light 15 towards a conditioning surface 543 which reflects the light towards the photovoltaic cell 24. Reflective surfaces 542c and 542d intercept the focused light 13 and reflect if towards the conditioning surface 543, which redirects the light towards the photovoltaic cell 24. The conditioning surface 543 may reflect the reflected light 15 one or more times. The conditioning optic 543 can include a parabolic section in cross section and other curved or flat portions in order to concentrate light towards the photovoltaic cell 24. The focusing optic 550 may include dead space 53 in the vicinity of the central axis 44.

Figure 14:
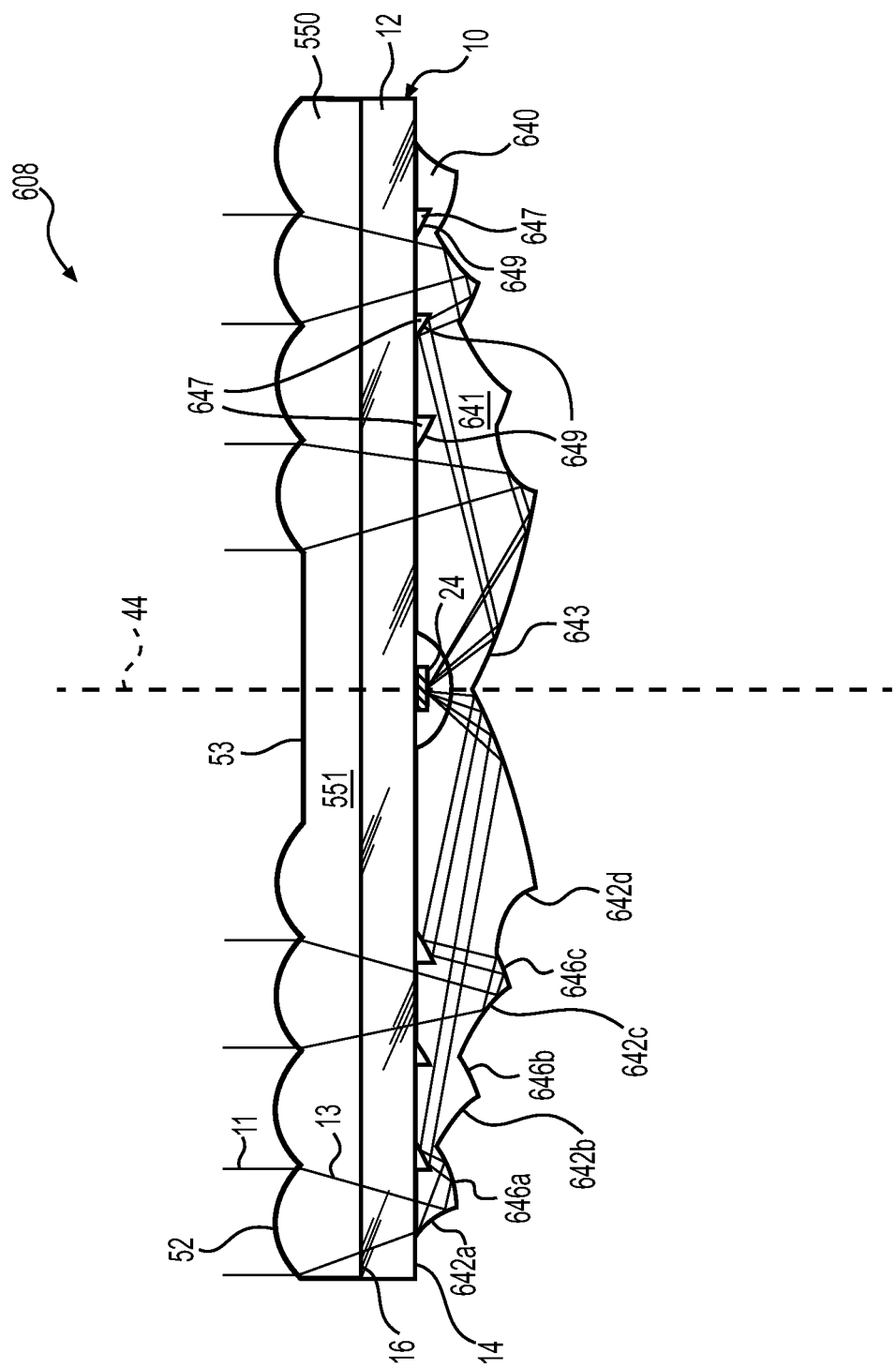
FIG. 14 is a cross-sectional view of another embodiment of an optical unit where the light guide optic includes tertiary reflectors.

FIG. 14 is a cross sectional view of an optical unit 608 generally similar to that of FIG. 13. In this embodiment the light guide optic 640 includes a plurality of reflective surfaces 642a-642d, each reflective surface 642a-642d having a different profile in cross section from the others, separated by a plurality of step surfaces 646a-646c each step surface 646a-646c having a different profile in cross section from the others. The step surfaces 646a-636c, unlike those described in earlier embodiments, are also reflective. Additionally, the light guide optic 640 includes a plurality of tertiary reflectors 647 with secondary reflective surfaces 649, opposite the step surfaces 646a-646c. For every reflective surface 642a-642c, excluding the reflective surfaces 643d nearest the central axis, there is a corresponding secondary reflective surface 649.

In this embodiment, light 11 impinging on the lenses 52 is focused by the lenses. The focused light 13 is transmitted through the light transmissive body 551 of the focusing optic 550, through the rigid sheet 12 and through the light transmissive body 641 of the light guide optic 640 onto a reflective surface 642a-642d. Although the reflective surfaces 642a-642c and the step surfaces 646a-646c need not be identical in shape, the trajectory of the light between them is similar: The focused light 13 is reflected by a reflective surface 642a-642c towards a corresponding step surface 646a-646c. The reflected light 15 is then reflected a second time by a step surface 646a-646c towards a corresponding secondary reflective surface 649 which reflects the light a third time towards a conditioning surface 643, which further reflects the light towards the photovoltaic cell 24.

Figure 15:
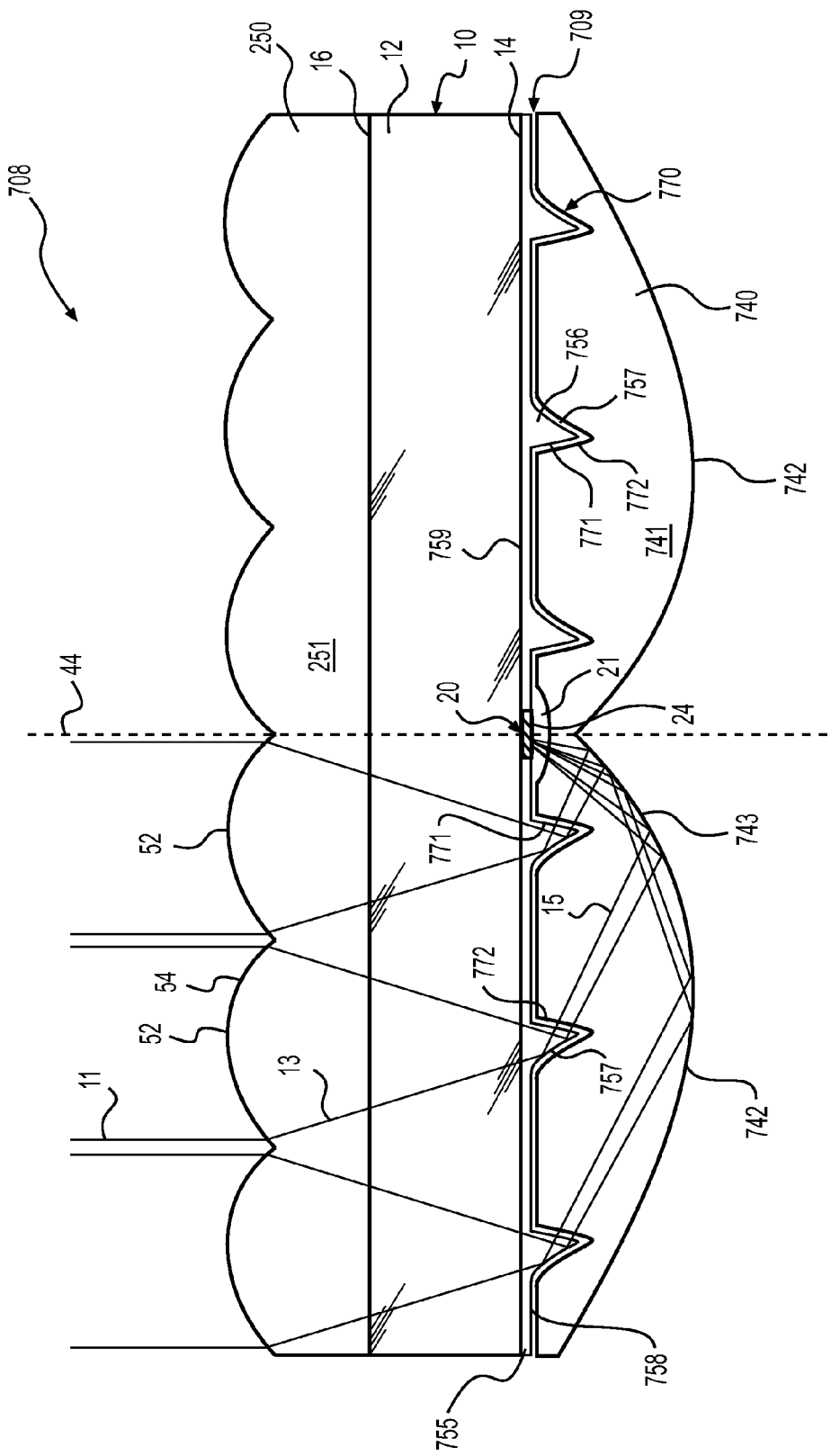
FIG. 15 is a cross-sectional view of an embodiment of an optical unit that has a redirecting optic between the receiver substrate assembly and the light guide optic.

FIG. 15 shows a cross section of an optical unit 708 having a focusing optic 250, a receiver substrate assembly 10, a redirecting optic 755, a low index film 709, and a light guide optic 740. The redirecting optic 755 can be made of light transmissive materials including glass, polymeric materials such as injection molded poly(methyl methacrylate) (PMMA), polymethyl methacrylimide (PMMI), polycarbonates, cyclo olefin polymers (COP), cyclo olefin copolymers (COC), polytetrafluoroethylene (PTFE), or silicones. In this embodiment, the redirecting optic 755 is assembled onto the first surface 14 of the rigid sheet 12, the planar surface 759 of the redirecting optic 755 being optically bonded thereto. The non-planar surface 758 of the redirecting optic 755 includes a plurality of redirecting elements 756 with redirecting surfaces 757, and is coated by a low index film 709, such that the focused light 13 is reflected by a redirecting surface 757 via TIR. Alternatively, the redirecting surfaces 757 may be coated with a reflective material, which may be more economical than coating the entire non-planar surface 758 with a low index film 709.

The light guide optic 740 includes a plurality of indentations 770 shaped to house the redirecting elements 756. The light guide optic 740 can be assembled onto and optically bonded to the redirecting optic 755 using optical adhesive such as silicone. The light guide optic further includes a reflective surface 742 that is continuous with a conditioning surface 743. Light 11 impinging on the surface 54 of the lenses 52 is focused and transmitted through the light transmissive body 251 of the focusing optic 250, through the rigid sheet 12, and into the redirecting optic 755, where the light is reflected by a redirecting surface 757. The reflected light 15 is transmitted out of the redirecting optic through output faces 771 adjacent to the redirecting surfaces 757, and into the light guide optic 740 through input faces 772, which are part of the indentations 770. In the light guide optic 740, the reflected light can be reflected by the reflective surface 742 directly to the photovoltaic cell, or to the conditioning surface 743. Light impinging on the conditioning surface 743 is concentrated towards the photovoltaic cell 24.

Figure 16:
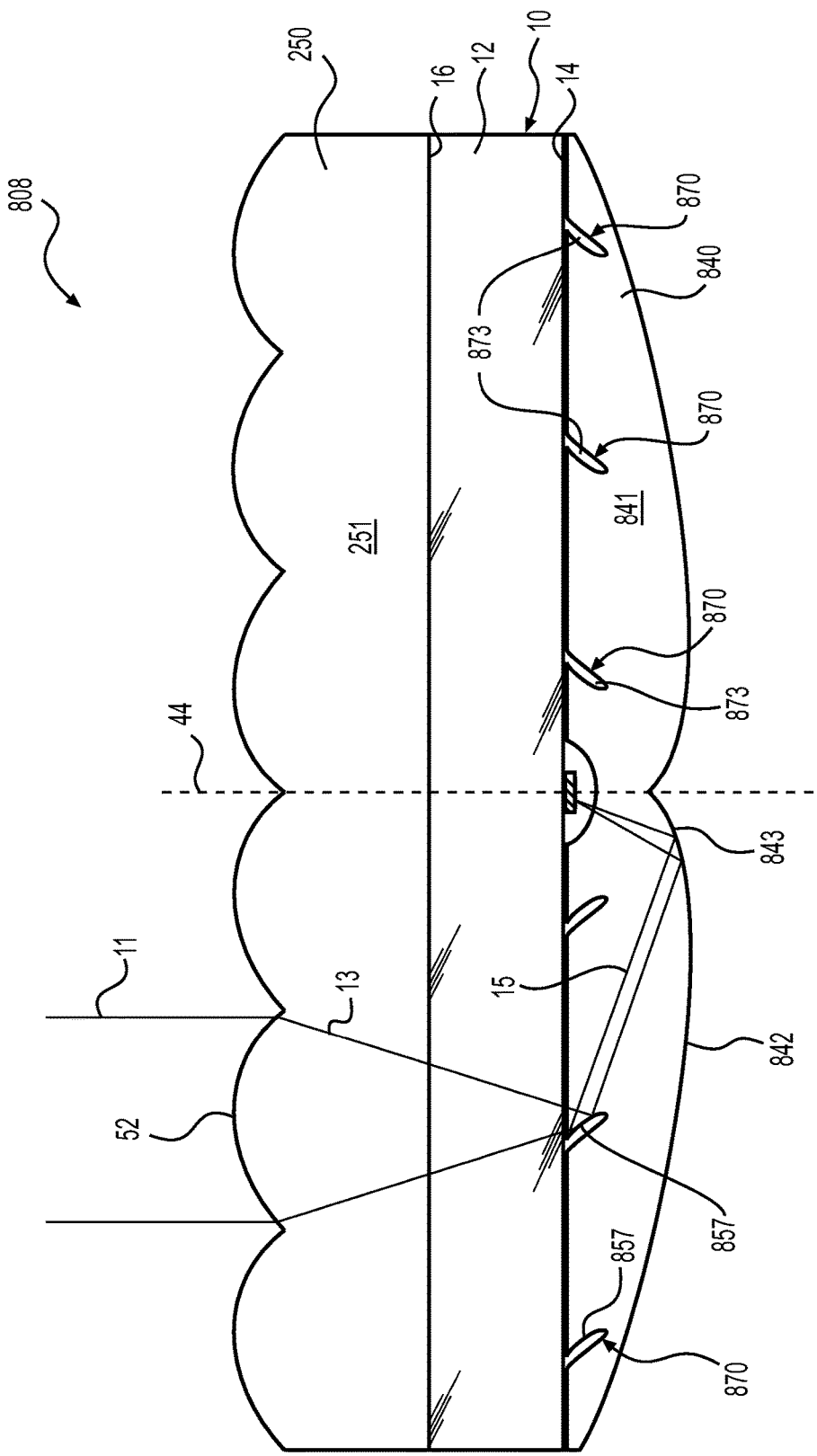
FIG. 16 is a cross-sectional view of another embodiment of an optical unit in which the light guide optic has tertiary reflectors.

FIG. 16 shows a cross section of an embodiment of an optical unit 808 in which the path of light is generally similar to that of FIG. 15. However, in this embodiment, the light guide optic 840 is made with a plurality of tertiary reflectors 870 including redirecting surfaces 857. When the light guide optic 840 is assembled onto the first surface 14, air fills the gap 873 between the first surface 14 and the tertiary reflector 870. In an alternative embodiment, the gap 873 can be filled with any suitable material having a refractive index lower than that of the light transmissive body 841.

In this embodiment the focused light 13 converges towards the focal point of the lens 52, but before reaching the focal point, it is intercepted by a redirecting surface 857 the reflects the focused light 13 by TIR. The reflective surface 842 is continuous with the conditioning surface 843. As in FIG. 15 the reflected light can be reflected by the reflective surface 842 directly to the photovoltaic cell, or to the conditioning surface 843. Light impinging on the conditioning surface 843 is concentrated towards the photovoltaic cell 24.

Figure 17:
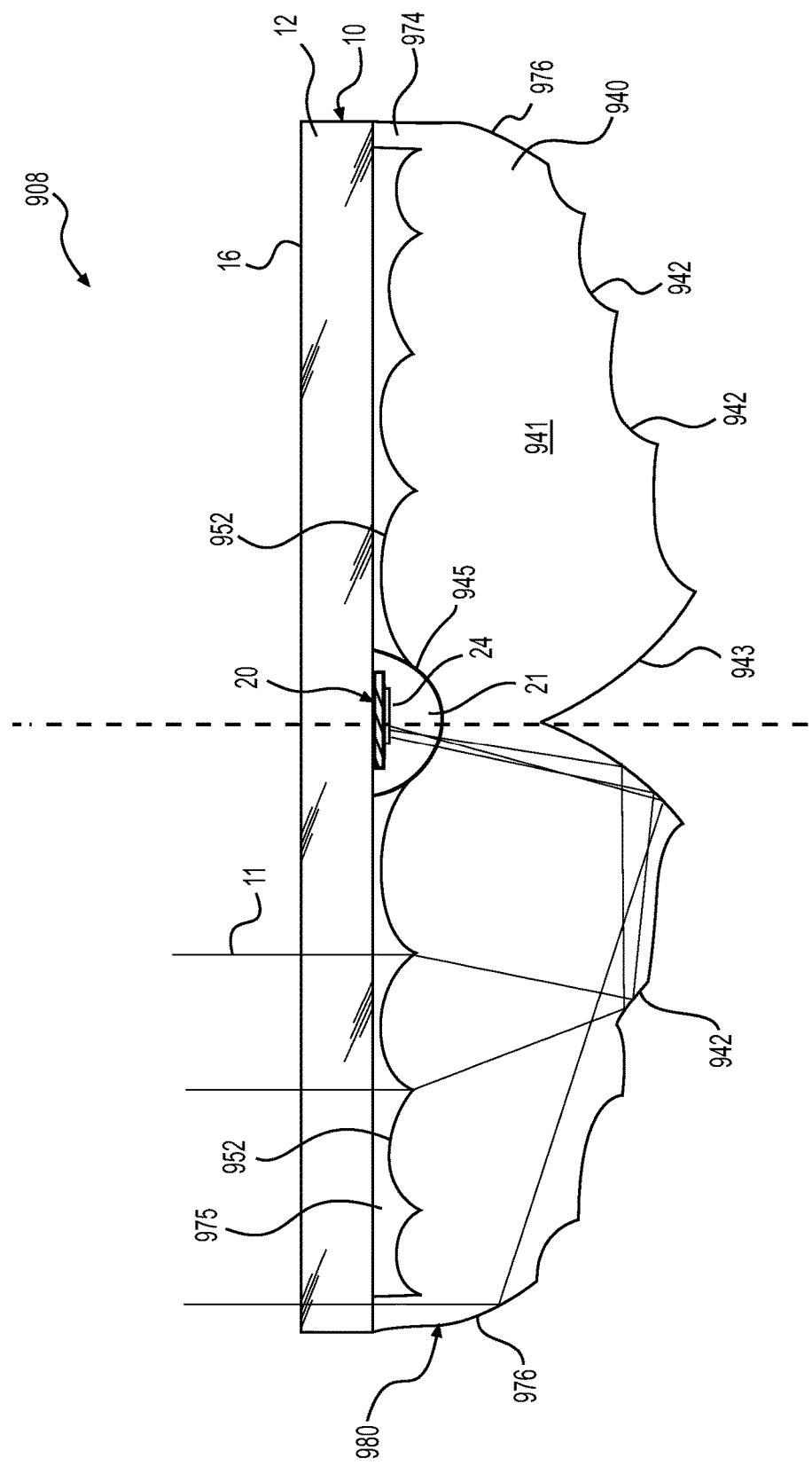
FIG. 17 is a cross-sectional view of an embodiment of an optical unit in which the light guide optic includes lenses.

FIG. 17 shows a cross section of an optical unit 908 in which the light guide optic 940 includes a plurality of lenses 952 and reflective surfaces 942, and is attached to the rigid sheet 12 by means of optical attachment features 974. The optical attachment features can be optically and mechanically bonded, by means of an optical adhesive, to the first surface 14 of the rigid sheet 12. Likewise, the cell envelope 21, which in this embodiment must be made of a solid, optically transmissive material such as silicone, is mechanically and optically bonded to a cavity 945 in the light guide optic 940.

Light 11 impinging on the second surface 16 of the rigid sheet 12, is transmitted to the light guide optic 940 through the optical attachment features 974 or through the lenses 952. Light 11 entering the light guide optic through the lenses 952 is transmitted from the first surface 14 of the rigid sheet 12 to a layer 975, which in some embodiments may be air or any suitable light transmissive material. From the layer 975, the light 11 is transmitted to the lenses 952 which focus the light towards reflective surfaces 942, which reflect the light towards a conditioning surface 943. Light 11 entering the light guide optic 940 through the optical attachment features 974 is transmitted directly from the first surface 14 of the rigid sheet to the optical attachment features 974. These optical attachment features 974 include reflecting surfaces 976 which reflect the light impinging thereon towards the conditioning surface 943. Light impinging on the conditioning surface 943 is then reflected towards the photovoltaic cell 24. The lenses 952 are largest near the central axis 44 and smallest near the peripheral edge 980 of the optical unit 908. This is to adjust the focal lengths of the lenses 952 so that the overall thickness of the light guide optic 940 may be reduced.

Figure 18:
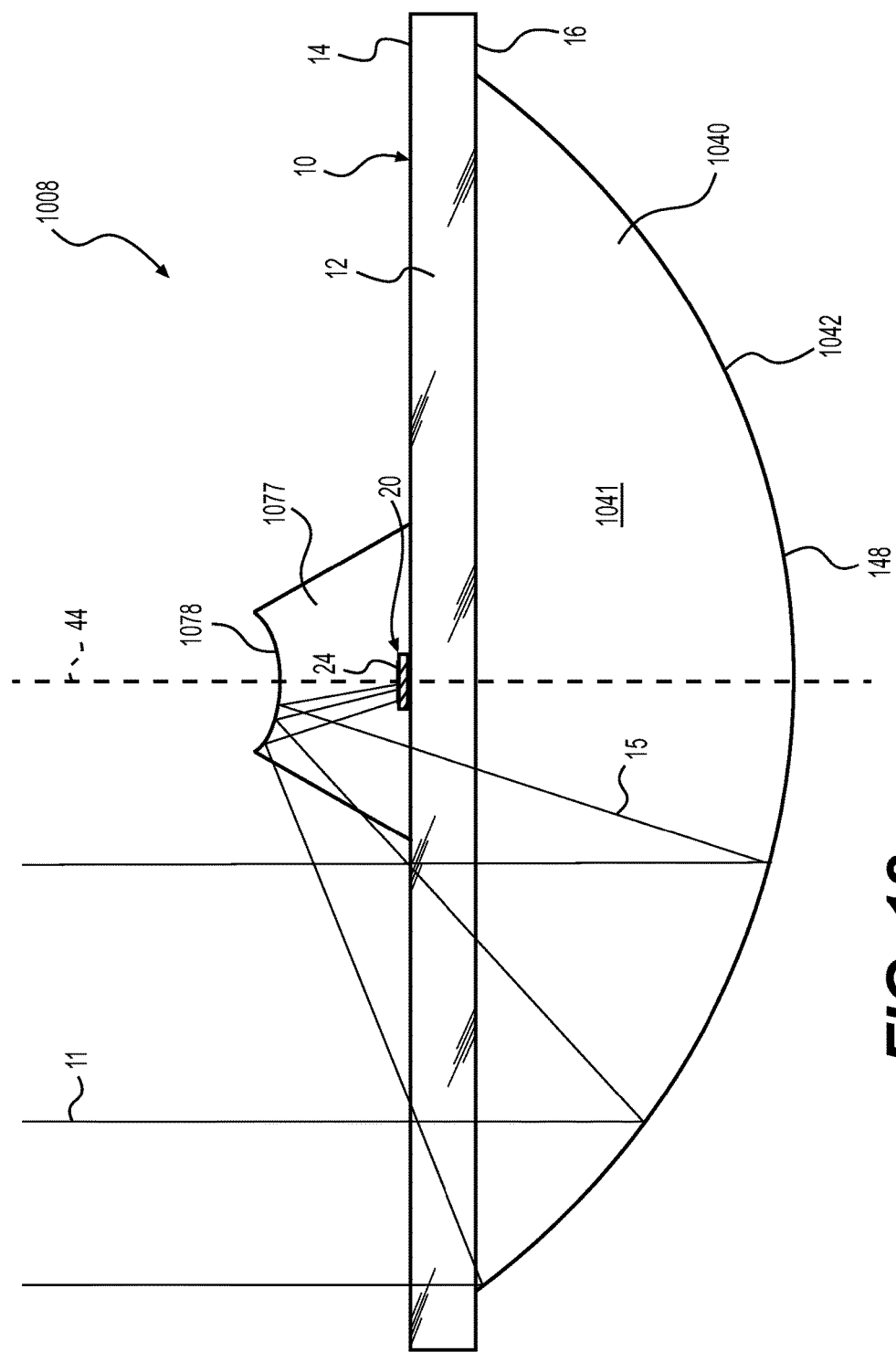
FIG. 18 is a cross-sectional view of an embodiment of an optical unit that has the receiver assembly on the second surface or the rigid sheet.

FIG. 18 shows a cross section of an optical unit 1008 having a parabolic light guide optic 1040 optically bonded to the second surface 16 of a receiver substrate assembly 10. In this embodiment, light 11 typically impinges on the rigid sheet 12 at an angle normal to the first surface 14. The light 11 is transmitted through the rigid sheet 12, exiting through the first surface 14 into the light guide optic 1040. The reflective surface 1042, which is a parabolic section in cross section, has a mirror coating 148 to reflect the light impinging thereon towards the focus of the parabola. The reflected light is transmitted through the light transmissive body 1041 of the light guide optic 1040 and back through the rigid sheet into a secondary optic 1077. The secondary optic includes a mirror coated hyperbolic surface 1078, which intercepts the light 15 before reaching the focus of the parabola. The hyperbolic surface 1078 redirects the light towards the photovoltaic cell 24. In this embodiment, the conductor pattern 30 and cell receiver assemblies 20 are assembled onto the first surface 14 of the rigid sheet 12.

Figure 19:
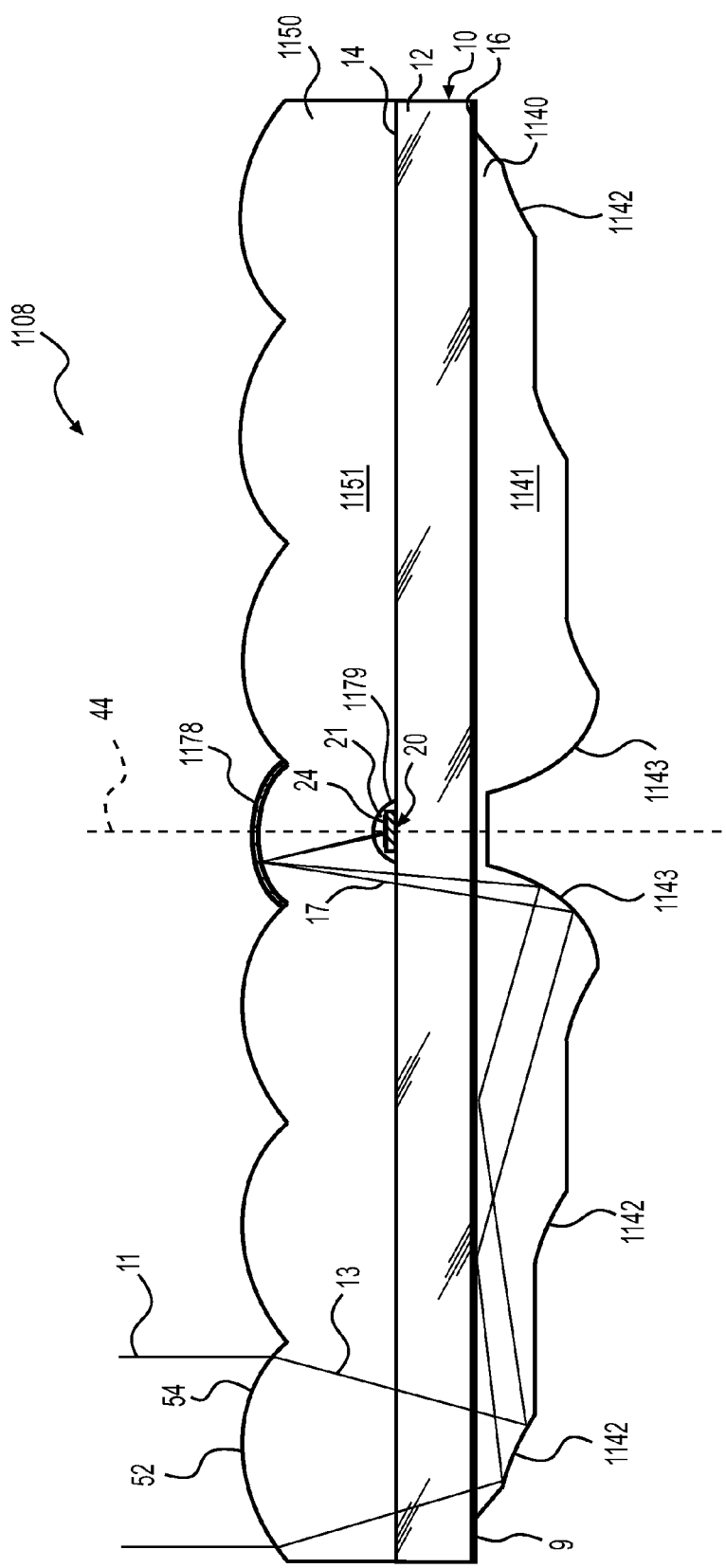
FIG. 19 is a cross-sectional view of another embodiment of an optical unit that has the receiver assembly on the second surface or the rigid sheet.

FIG. 19 is a cross sectional view of an optical unit 1108 having the light guide optic 1140 assembled onto the second surface 16 of the rigid sheet 12 and the conductor pattern 30 and the receiver assembly 20 on the first surface 14 of the rigid sheet 12. In this embodiment the focusing optic 1150 includes a secondary reflector surface 1178 and a cavity 1179 for housing the cell envelope 21, which in this embodiment extends from the first surface 14 of the rigid sheet 12, covering the photovoltaic cell 24 and the receiver assembly 20.

Light 11 impinging on the surface 54 of the lenses 52, is focused and transmitted through the light transmissive body 1151 of the focusing optic 1150, through the rigid sheet 12 and through the light transmissive body 1141 of the light guide optic 1140. Before the focused light 13 reaches the focus of the lens 52, it is intercepted by a reflective surface 1142 which reflects the light towards a conditioning surface 1143. The conditioning surface 1143 reflects the light back through the rigid sheet 12 and the light transmissive body 1151 of the focusing optic 1150 to the secondary reflector surface 1178 which focuses the concentrated light 17 onto the photovoltaic cell 24. Reflections on the secondary reflector surface 1178 may be TIR or specular reflections off a mirror coating applied to the secondary reflector surface 1178.

Figure 20:
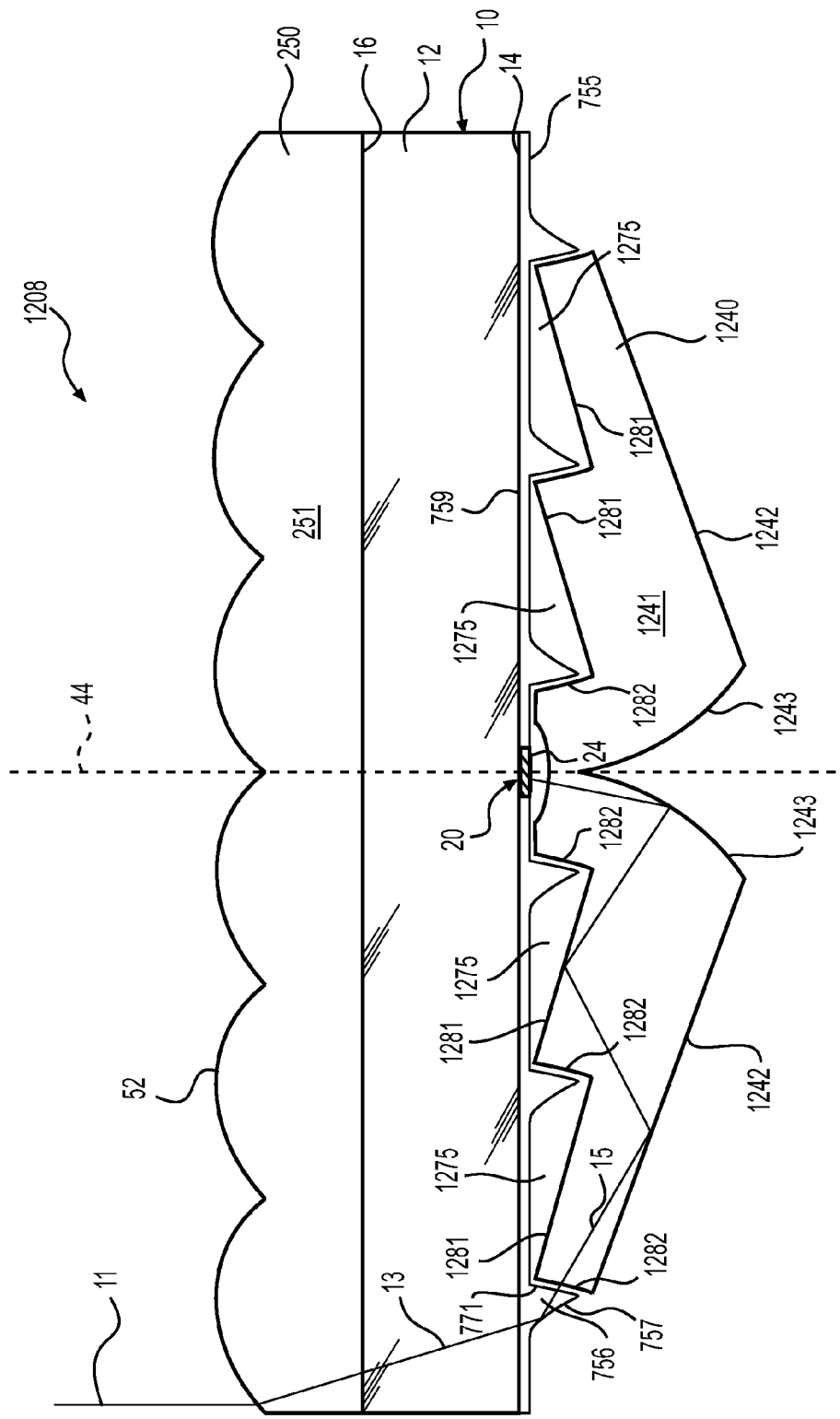
FIG. 20 is a cross-sectional view of another embodiment of an optical unit that has a redirecting optic between the receiver substrate assembly and the light guide optic.

FIG. 20 shows a cross section of an optical unit 1208 generally similar to the embodiment of FIG. 15 in that it includes a focusing optic 250, a receiver substrate assembly 10, a redirecting optic 755, and a light guide optic 1240.

The light guide optic 1240 includes a planar reflective surface 1242, a plurality of step reflector surfaces 1281 opposite to the planar reflective surface 1242 and a conditioning surface 1243. The step reflector surfaces 1281 are separated by input surfaces 1282 which are generally perpendicular to the step reflector surfaces 1281.

Light 11 is focused by the lenses 52 and then reflected by the redirecting surfaces 757. The light 15 reflected by the redirecting surface 757 exits the redirecting elements 756 through the output surfaces 771, and enters the light guide optic 1240 through the input surfaces 1282. The reflected light is then transmitted in the light guide optic 1240 by total internal reflections on the planar reflective surface 1242 and on the plurality of step reflector surfaces 1281 until it reaches the conditioning surface 1243 which reflects the light towards the photovoltaic cell 24, There is an area 1275 between the redirecting optic 755 and the light guide optic 1240 that can be filled with air or any suitable light transmissive material such as an optical adhesive.

Figure 21:
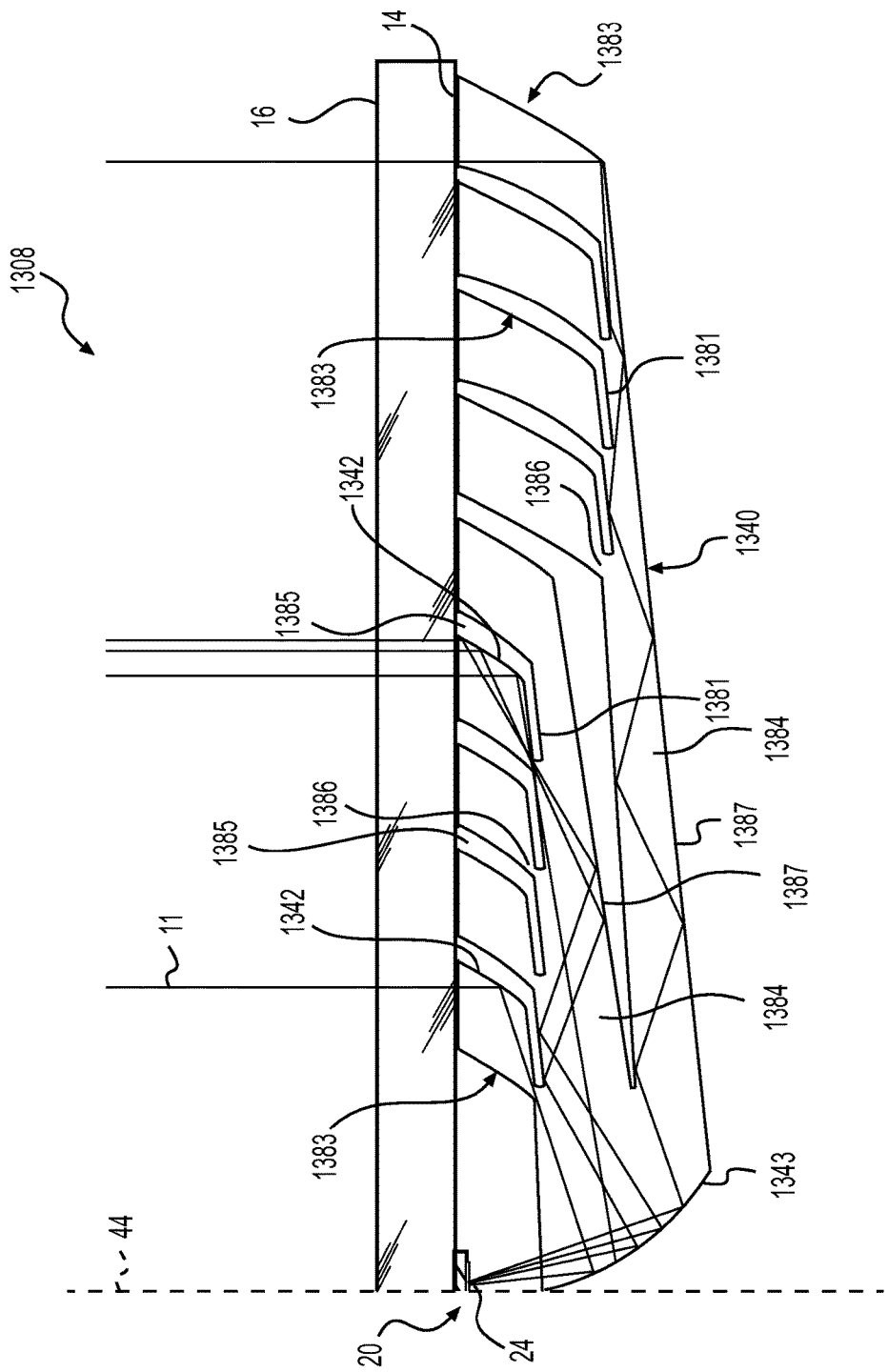
FIG. 21 is a cross-sectional view of an embodiment of an optical unit in which the light guide optic has focussing portions and guiding portions.

FIG. 21 is a cross section of an optical unit 1308 in which the light guide optic 1340 includes focusing portions 1383 and guiding portions 1384. The focusing portions 1383 include a plurality of reflecting surfaces 1342 to reflect the light 11 into the guiding portions 1384. The light guide optic 1340 has a plurality of reflector elements 1385 that can be filled with air or a light transmissive material having a lower index of refraction than the light guide optic 1340, to allow TIR on the reflective surfaces 1342 and on a plurality of step reflector surfaces 1381.

In this embodiment, light 11 enters the optical unit 1308 through the second surface 16 and is transmitted to the plurality of reflecting surfaces 1342 which reflect the light through an output area 1386 to a guiding portion 1384. The light in the guiding portions 1384 is transmitted via total internal reflections on the step reflector surfaces 1381 and on planar reflectors 1387 positioned opposite to the step reflector surfaces 1381. The guiding portions 1384 guide the light towards a conditioning surface 1343 which focuses the light onto the photovoltaic cell 24. Although, FIG. 21 shows a light guide optic 1340 with two guiding portions 1384 and two focusing portions 1383, it is possible to manufacture an optical unit with any number of focusing portions and corresponding guiding portions.

Figure 22:
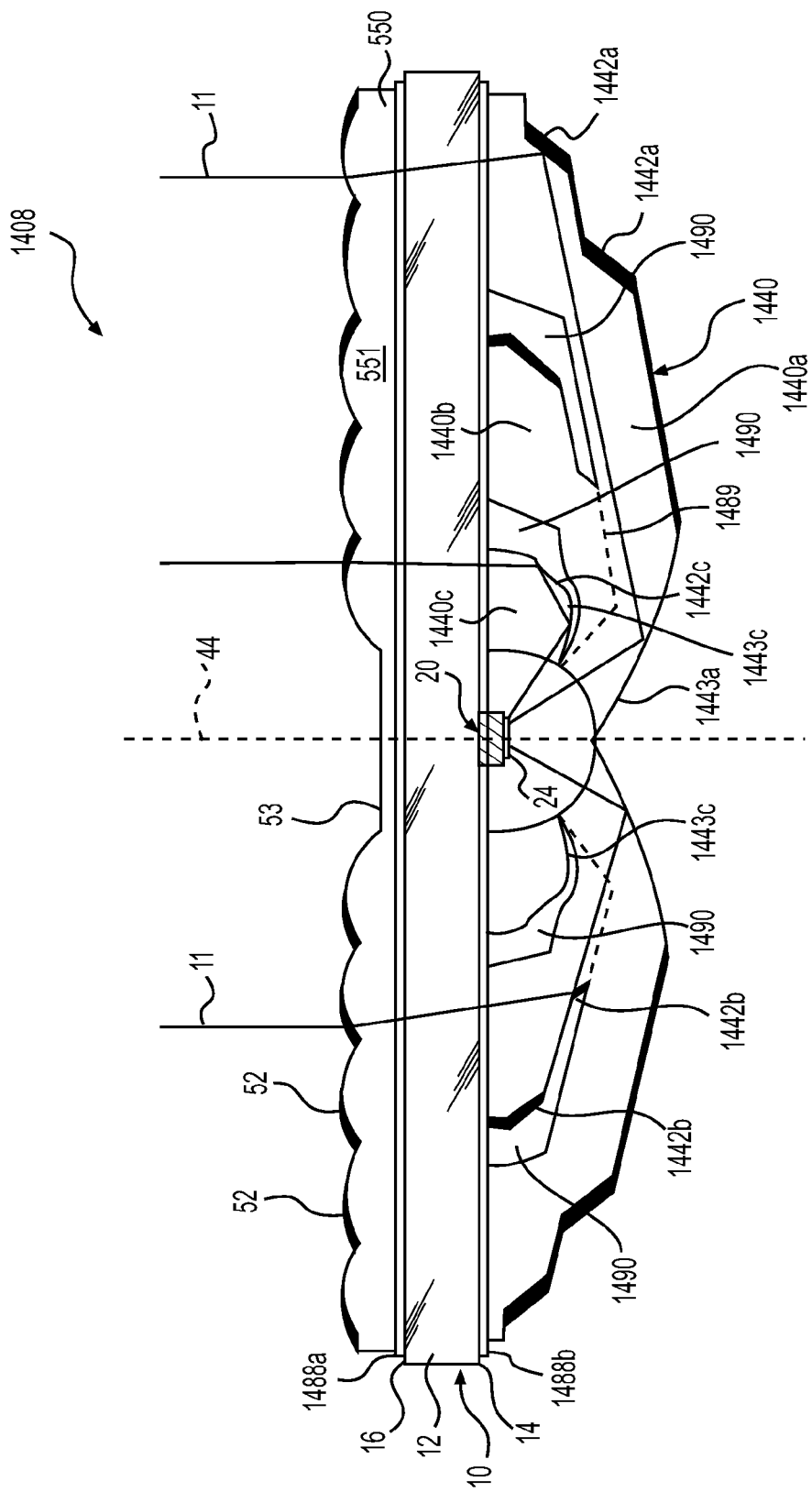
FIG. 22 is a cross-sectional view of an embodiment of an optical unit in which the light guide has three stages.

Turning to FIG. 22 there is provided an optical unit having a light guide optic 1440 composed of three light guide stages 1440a, 1440b, 1440c. The first light guide stage 1440a includes reflecting surfaces 1442a and a first conditioning surface 1443a; the second light guide stage 1440b includes reflecting surfaces 1442b; and the third light guide stage 1440c includes a reflecting surface 1442c and a second conditioning surface 1443c. The three light guide stages 1440a, 1440b, 1440c can manufactured separately, for example, by injection molding, 3D printing or embossing, and subsequently assembled together. The first and second light guide stages 1440a and 1440b are optically bonded, for example, by means of an optical bonding agent at the bonding interface surface 1489 denoted by the dotted line. Further, all three light guide stages 1440a, 1440b, 1440c can be bonded to the first surface 14 of the rigid sheet 12 by means of an optical bonding agent 1488b, for example a polymer such as silicone rubber or gel. As shown in FIG. 22, when the light guide optic 1440 is assembled, gaps 1490 remain between the light guide stages 1440a, 1440b, 1440c. These gaps 1490 allow for TIR on the reflecting surfaces 1442a, 1442b, 1442c and on the conditioning surfaces 1443a, 1443c.

A focusing optic 550 is optically and mechanically bonded to the second surface 16 of a rigid sheet 12 also by means of an optical bonding agent 1488a, for example a polymer such as silicone rubber or gel. Light 11 impinging on the lenses 52 are focused towards the reflecting surfaces the 1442a, 1442b and 1442c. The reflecting surfaces 1442a and 1442b of the first and second light guide stages 1440a, 1440b reflect the light towards the first conditioning surface 1443a. Light travels from the second light guide stage 1440b to the first light guide stage 1440a through the bonding interface 1489. The first conditioning surface 1443a reflects the light towards the photovoltaic cell 24. The reflecting surface 1442c of the third light guide stage 1440c reflects light towards the second conditioning surface 1443c, which reflects the light towards the photovoltaic cell 24.

Figure 23:
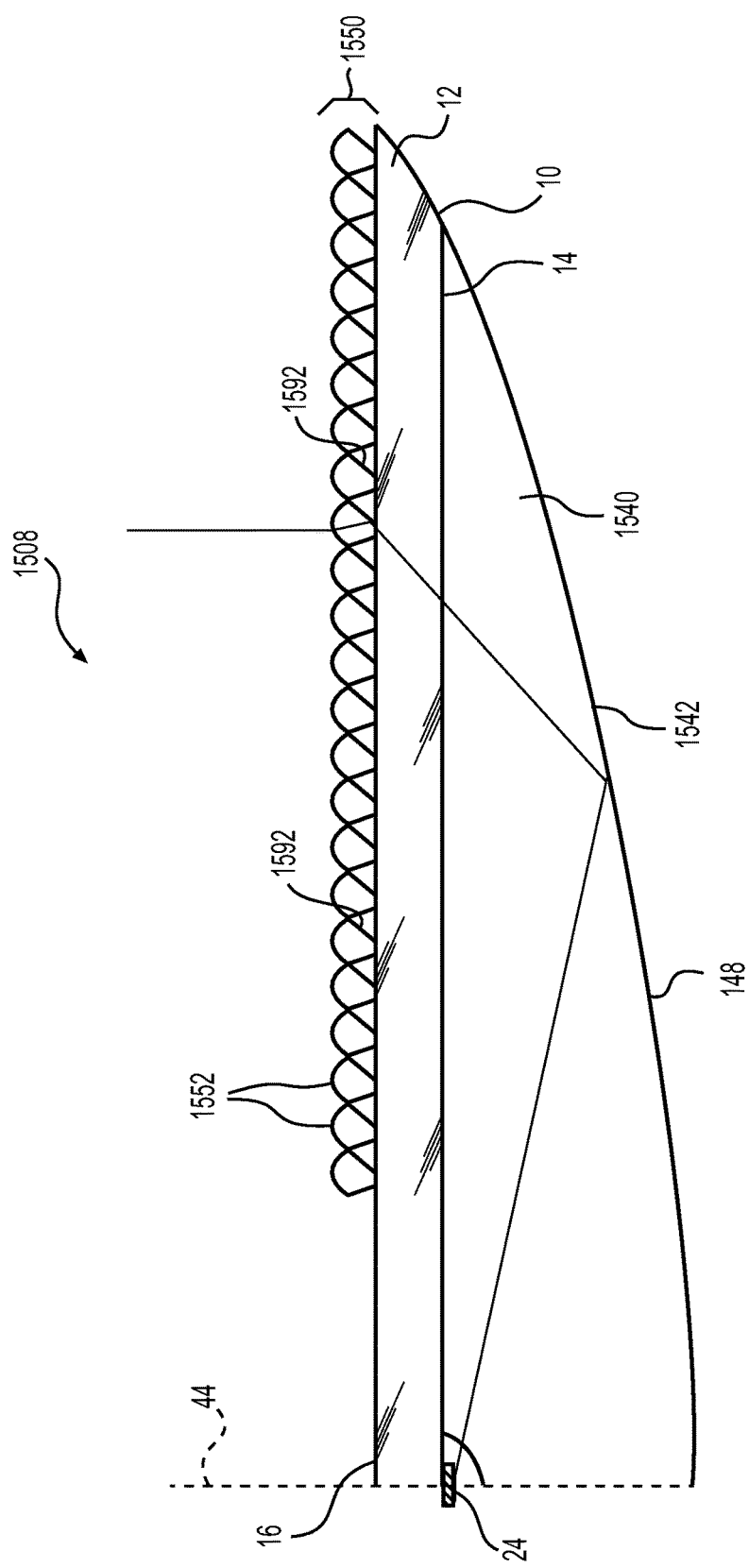
FIG. 23 is a cross-sectional view of an embodiment of an optical unit in which the focusing optic has lenses and redirecting surfaces.

FIG. 23 shows a cross section of an optical unit 1508 in which the focusing optic 1550 includes a plurality of lenses 1552 and a plurality of redirecting surfaces 1592. In this embodiment the light guide optic 1540 has reflecting surface 1542 coated with a mirror coating 148. Light impinging on the lenses 1552 is focused towards the redirecting surfaces 1592 which reflect the light through the rigid sheet 12 into the light guide optic 1540. In the light guide optic 1540, the light 1542 is transmitted towards the reflecting surface 1542, which reflects the light towards the photovoltaic cell 24.

Figure 24A:
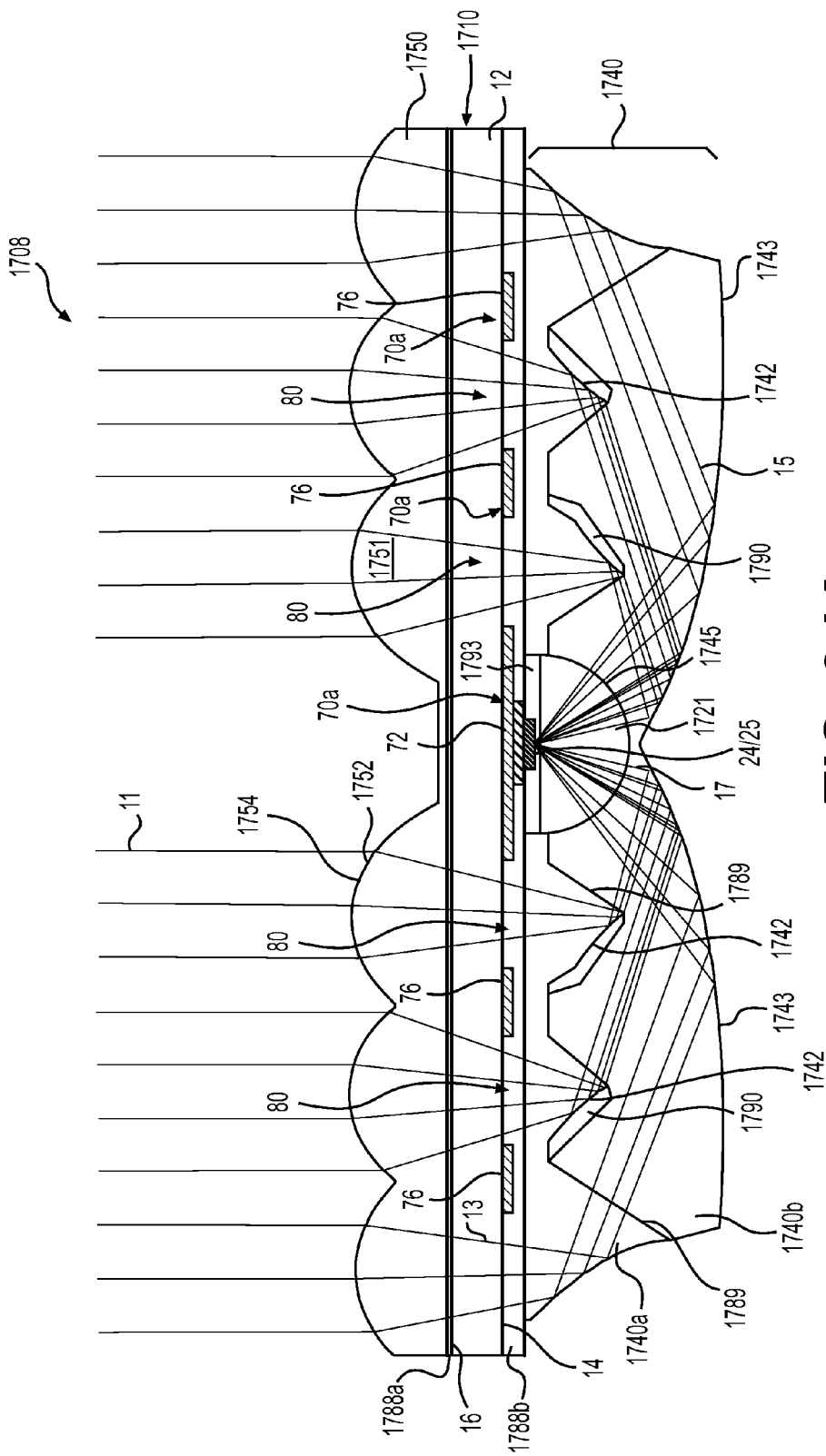

As described in FIGS. 7A and 7B, conductor patterns employing heat spreader portions 70 may be electrically and thermally connected to the interconnection traces 32 of an optical unit 8 in order to cool larger optical units 8. FIG. 24A shows a cross section of an optical unit 1708 employing conductor patterns such as those described in FIGS. 7A and 7B. This figure illustrates how the path of the focused light 13 is not interrupted by the positive arms 76 or negative arms 78 of the heat spreader portion 70a, and instead, the light 13 is transmitted through the gaps 80, into the light guide optic 1740.

The optical unit 1708 shown in FIG. 24A includes a focusing optic 1750, two layers of an optical bonding agent 1788a, 1788b, a receiver substrate assembly 1710, and a light guide optic 1740. The focusing optic 1750 is optically and mechanically bonded to the second surface 16 of the rigid sheet 12 by means of an optical bonding agent 1788a. The light guide optic 1740 includes a redirecting portion 1740a and a guiding portion 1740b which can be manufactured separately, for example by injection molding or embossing, and then assembled together by means of an optical adhesive or any suitable optical bonding means. When assembled together, gaps 1790 remain between the redirecting portion 1740a and the guiding portion 1740, to enable TIR at a plurality of reflective surfaces 1742 of the redirecting portion 1740a.

As will be appreciated by those skilled in the art, optics of any of the optical units described above can be employed as a solar concentrator by reversing the direction of light travelling therethrough and replacing the photovoltaic cell 24 with a light source 25, such as a light-emitting diode (LED) or an organic light-emitting diode (OLED), a plasma light bulb, fluorescent light bulbs, or any other type of suitable light-source. In some embodiments the light source 25 can be an optical fibre transferring light from source remote originating source (not shown). In order to illustrate this duality of the optical units, the direction of light rays 11 of FIGS. 24A-26 are omitted in order to show that the light could be entering the optical unit through the lenses 1752, or it could be emerging therefrom. The heat produced by the photovoltaic cell 24 or light source 25 is transmitted away from the central axis 44 towards the edges by means of the positive arms 76 and the negative arms 78. The direction of heat transfer is shown in FIG. 24B by arrows 1794.

In this embodiment, the receiver assembly 20 is coated with an optical and dielectric encapsulant 1793, which in some embodiments may be the same material as the optical bonding agent 1788b. The envelope 1721 thermally insulates the photovoltaic cell 24 or the light source 25 from the light guide optic 1740. The envelope 1221 can be a separate molded component. However, in one alternative embodiment, the optical bonding agents 1788b, the encapsulant 1793 and the envelope 1721 can all be made of the same material, for example silicone, and therefore they would be a single component.

It is possible to assemble the light guide optic 1740 with the envelope 1721 into a single solid piece by attaching the envelope 1721 to a cavity 1745 in the light guide optic 1740. The redirecting portion 1740a, the guiding portion 1740b and the envelope can be manufactured separately, for example by injection molding, and subsequently bonded together by means of a suitable bonding agent before being assembled onto the first surface 14 of the receiver substrate assembly 1710 by means of the optical bonding agent 1855b. FIG. 24C shows how the redirecting portion 1740a, the guiding portion 1740b and the envelope 1721 fit together.

An optical unit 1708 such as the one shown in FIGS. 24A-24C can behave as a solar concentrator by focusing light 11 impinging on the surface 1754 of the lenses 1752. The focussed light 13 is transmitted through the light transmissive body 1751 of the focusing optic 1740, the optical bonding agents 1788a, 1788b, the rigid sheet 12 and through the gaps 80 of the heat spreader portion 70a of the conductor pattern 30 into the redirecting portion 1740a of the light guide optic 1740. The focussed light 13 is intercepted by a reflective surface 1742, which reflects the light through the bonding interface 1789 into the guiding portion 1740b where the light is reflected towards the photovoltaic cell 24 by a conditioning surface 1743.

The same optical unit 1708 of FIGS. 24A-24C can be used as an illumination device in the following manner. Light 17 diverging away from the light source 25 is transmitted through the encapsulant 1793 and the envelope 1721 into the guiding portion 1740b of the light guide optic 1740. The conditioning surface 1743 then reflects the light through the bonding interfaces 1789 into the redirecting portion 1740a of the light guide optic 1740 where the reflective surfaces 1742 reflect the light such that it diverges away from the reflective surfaces 1742 towards the lenses 1752. The light 13 diverges away from the reflective surfaces 1742 to the lenses 52 through gaps 80 in the heat spreader 70a of the portion of the conductor pattern, thereby avoiding the positive and negative arms 76, 78 and the positive and negative termini 72, 74. The lenses 1752 collimate the output light 11.

Figure 25:
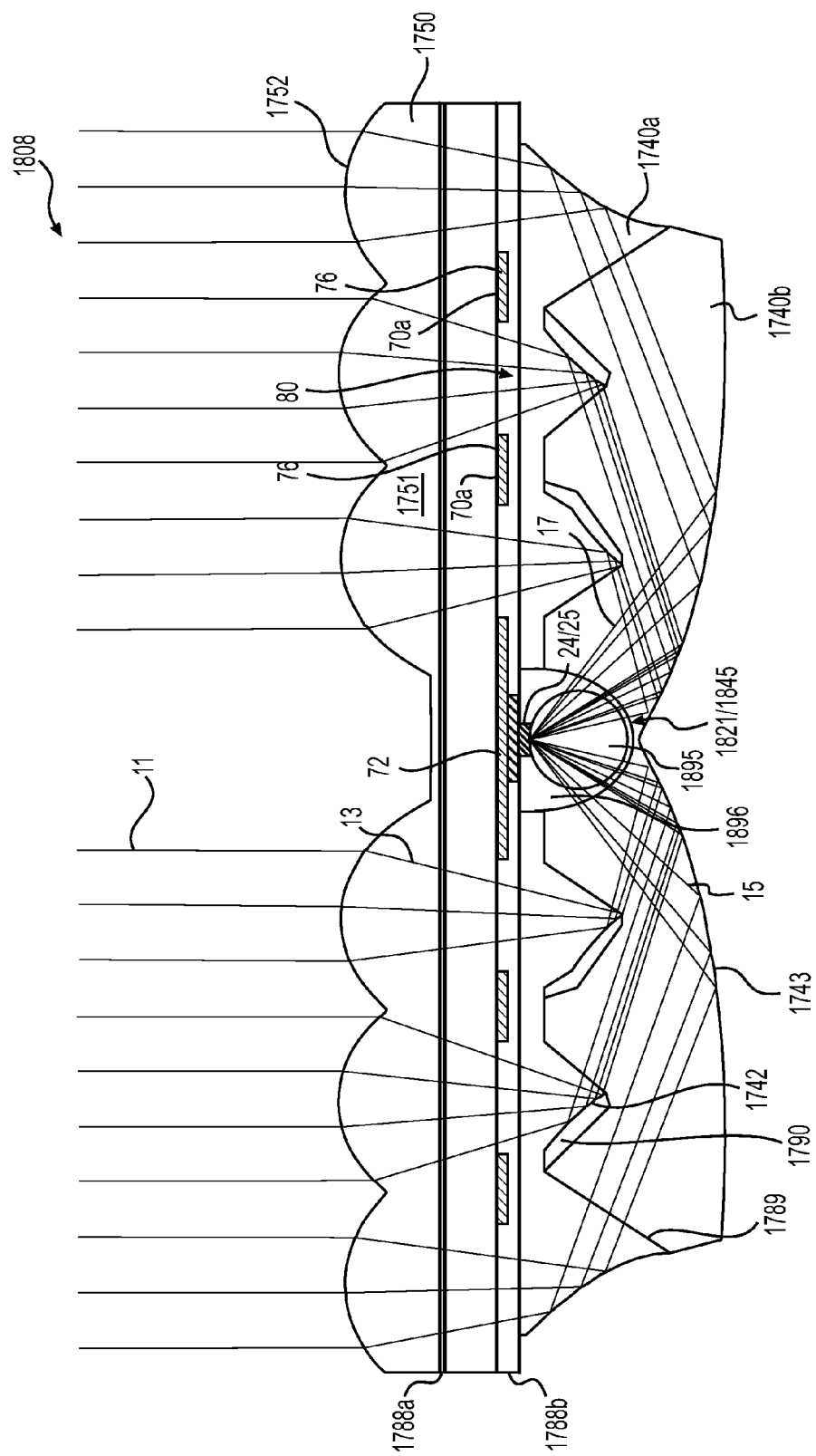
FIG. 25 is a cross-sectional view of another embodiment of an optical unit transmitting light through the gaps in a heat spreader portion, and where the light guide optic has a redirecting portion and a guiding portion.
Figure 26:
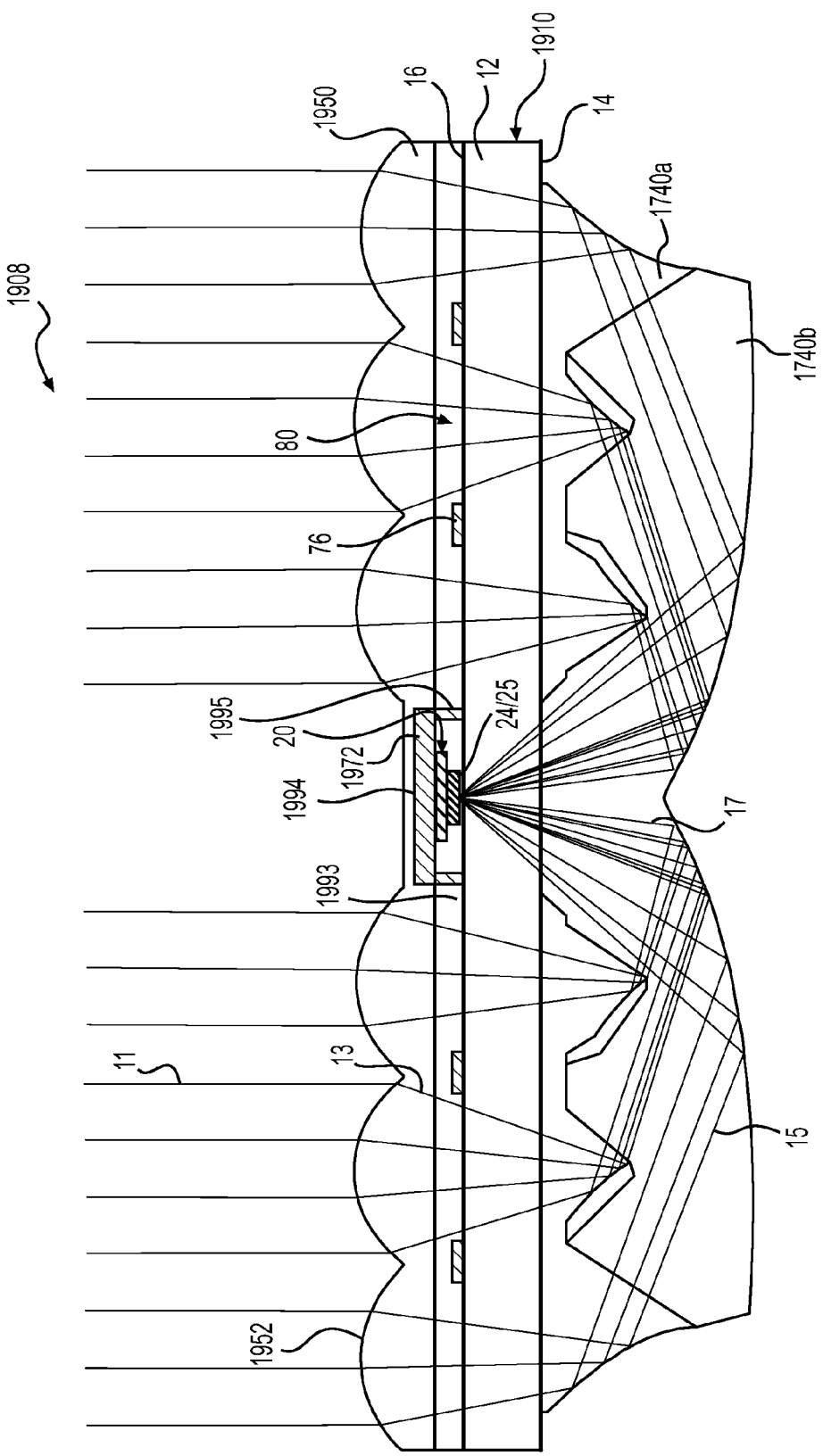
FIG. 26 is a cross-sectional view of another embodiment of an optical unit transmitting light through the gaps in a heat spreader portion, and where the light guide optic has a redirecting portion and a guiding portion.

FIG. 25 show a cross section of an optical unit 1808 generally similar to the embodiment shown in FIGS. 24A-24C and any elements not described in relation to this embodiment below can be found in the description of the embodiment above. The embodiment of FIG. 25 differs from that of FIGS. 24A-24C only in that the envelope 1821 includes a spherical optic 1895 and an encapsulating material 1896. The spherical optic 1895 can be a bead made of a light transmissive material capable of withstanding a high flux of light, such as glass or silicone. The encapsulating material can be air or any suitable light transmissive material. In some embodiments the encapsulating material may be the same material as the bonding agent 1788b.

It is also possible to use the rigid sheet 12 for the same purpose as an envelope 21, where the rigid sheet is made of a thermally insulating material such as glass. This can be achieved by positioning the photovoltaic cell 24 or the light source 25 against the second surface 16 with an encapsulant 1993 between the glass and the receiver assembly 20. This encapsulant 1993 may extend to the edges of the optical unit 1908 encapsulating the positive and negative arms 96,98 and forming an optical bond between the focusing optic 1750 and the receiver substrate assembly 1910. In this embodiment, the positive terminus 1972 is raised away from the positive and negative arms 76, 78, and therefore, the focusing optic 1950 has a groove 1994 to house the positive terminus 1972. The positive terminus 1972 has extensions 1995 that extend to the glass in order to transfer heat thereto.

It will be appreciated by those skilled in the art that the photovoltaic cells 24 described above can be replaced by any suitable solar energy collector.

Figure 27:
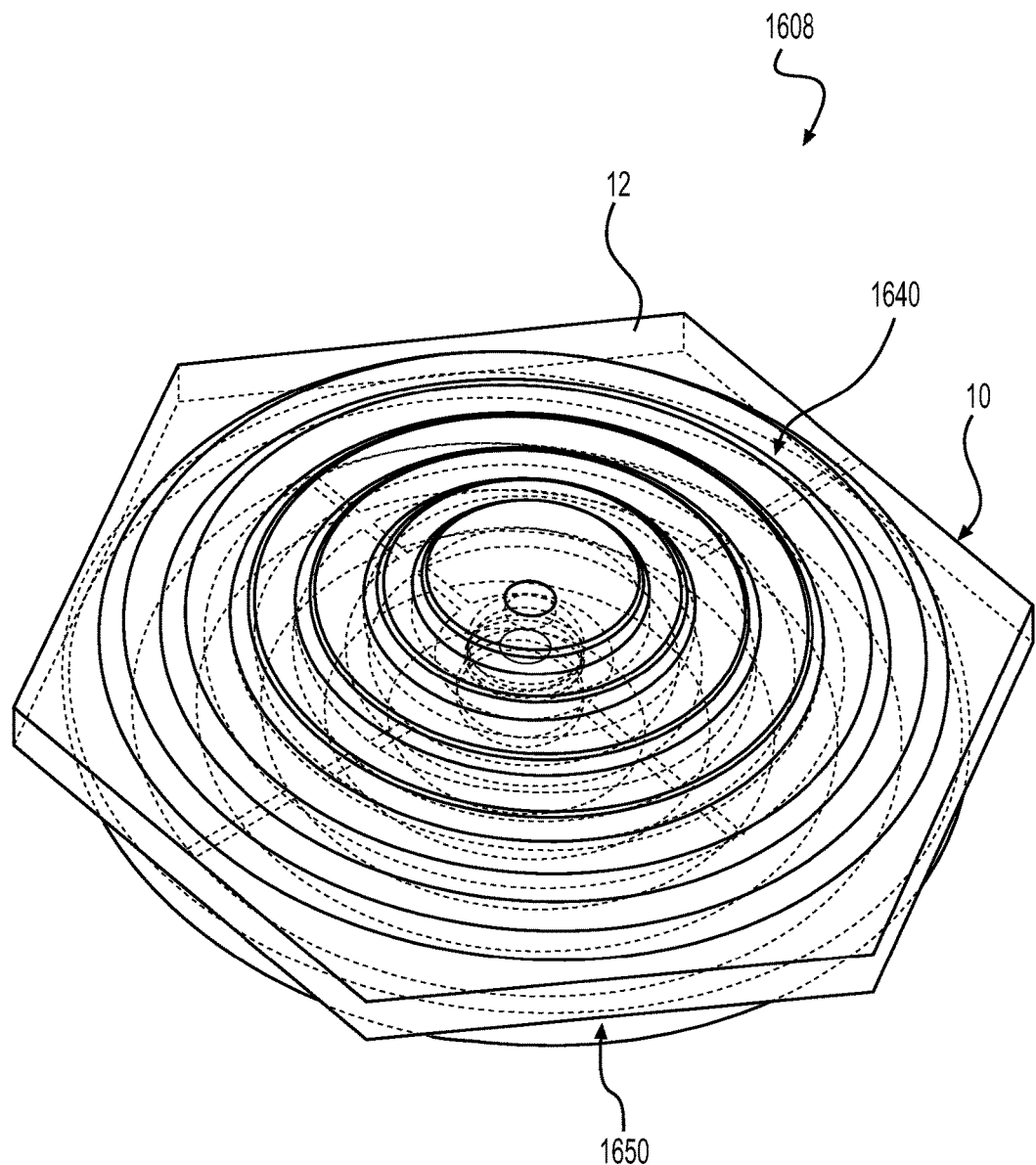
FIG. 27 is a perspective view of another embodiment of an optical unit.

FIG. 27 is an isometric view of an assembled optical unit 1608 including a light guide optic 1640, a receiver substrate assembly 10 and a focusing optic 1650. The rigid sheet 12 is cropped into a hexagonal shape for the purpose of illustrating a single assembled optical unit, however a CPV 2, as shown in FIG. 2, panel may include several optical units on a single rectangular receiver substrate assembly. Although this embodiment shows a circular light guide optic 1640 and a circular focusing optic 1650, these can be cropped into a tillable shape such as a square or a hexagon to eliminate dead space.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

The invention claimed is:

1. An illumination panel comprising:
    a receiver substrate assembly including:
        a rigid sheet of light transmissive material having a first surface, a second surface opposite the first surface, and a conductor pattern attached to the first surface; and
        at least one receiver assembly affixed to the rigid sheet, each receiver assembly including a light source in electrical communication with the conductor pattern;
    at least one reflecting optic attached to and supported by one of the first surface and the second surface of the receiver substrate assembly, each reflecting optic in optical communication with the light source of an associated one of the at least one receiver assembly, reflecting light received therefrom, at least a portion of the reflected light diverging from an optical axis of the reflecting optic; and at least one refracting optic attached to and supported by an other one of the first surface and the second surface of the receiver substrate assembly, each refracting optic associated with and in optical communication with one of the at least one reflecting optic, each refracting optic comprising at least one curved refracting surface, the divergent reflected light being refracted and collimated by the at least one curved refracting surface.

2. The illumination panel of claim 1, wherein each reflecting optic comprises at least one reflective surface for guiding light received from the light source out through the receiver substrate assembly.

3. The illumination panel of claim 1, wherein the at least one refracting element includes a lens.

4. The illumination panel of claim 1, wherein the conductor pattern includes two or more bus bars.

5. The illumination panel of claim 1, wherein the light transmissive material of the rigid sheet is a thermally insulating material.

6. The illumination panel of claim 1, wherein the light transmissive material of the rigid sheet is glass.

7. The illumination panel of claim 1, wherein the first and second surfaces of the rigid sheet are flat and parallel to each other.

8. The illumination panel of claim 1, wherein the reflecting optic is made of a different material than the rigid sheet.

9. The illumination panel of claim 1, wherein the reflecting optic is made of poly(methyl) methacrylate.

10. The illumination panel of claim 1, wherein the refracting optic is made of a different material than the rigid sheet.

11. The illumination panel of claim 1, wherein the refracting optic is made of poly(methyl) methacrylate.

12. The illumination panel of claim 1, wherein at least one of the at least one reflecting optic and the at least one refracting optic is 3D printed onto the rigid sheet.

13. The illumination panel of claim 1, wherein the conductor pattern comprises at least two bus bars and a plurality of interconnection traces for electrical connection of the at least one receiver assembly to the bus bars.

14. The illumination panel of claim 1, wherein the conductor pattern comprises a heat spreader portion.

15. The illumination panel of claim 14, wherein the heat spreader portion comprises a positive half and a negative half, each half comprising a plurality of arms in the shape of circular arcs and a terminus interconnected by an interconnection trace.

16. The illumination panel of claim 1, wherein the conductor pattern is metalized onto the first surface.

17. The illumination panel of claim 1, wherein the conductor pattern is formed from a sheet of conductive material.

18. The illumination panel of claim 1, wherein the conductor pattern comprises a heat spreader portion.

19. The illumination panel of claim 18, wherein the conductor pattern is disposed between the rigid sheet and one of the reflecting optic and the at least one refracting optic, and the heat spreader portion is shaped and positioned so as to avoid blocking light transmitted from the reflecting surfaces of the reflecting optic to the at least one refracting optic.

20. A panel comprising:
a rigid sheet of light-transmissive material having a first surface and a second surface opposite the first surface, a light source being affixed to one of the first surface and the second surface;

at least one reflecting optic attached to and supported by one of the first surface and the second surface of the rigid sheet of light-transmissive material, the at least one reflecting optic being in optical communication with the light source and having at least one reflective surface, reflecting light received therefrom, at least a portion of the reflected light diverging from an optical axis of the reflecting optic;

at least one refractive optic attached to and supported by an other one of the first surface and the second surface of the rigid sheet of light-transmissive material, the least one refractive optic associated with and in optical communication with one of the at least one reflecting optic, each refractive optic having at least one refractive element for cooperative operation with the at least one reflecting optic, each refractive optic having at least one curved refracting surface, the divergent reflected light being refracted and collimated by the curved refracting surface; and the light source being intermediate the at least one reflecting optic and the at least one refractive optic.

21. An illumination panel comprising:
a receiver substrate assembly including:
a rigid sheet of light transmissive material having a first surface, a second surface opposite the first surface; and
a light source affixed to the first surface of the rigid sheet and in electrical communication with a conductor;

a refracting optic attached to and supported by one of the first surface and the second surface of the receiver substrate assembly, the refracting optic having a plurality of concentric ring-shaped lenses and a light-transmissive body, each of the concentric ring-shaped lenses having a curved refractive surface;

a reflecting optic attached to and supported by an other of the first surface and the second surface of the receiver substrate assembly, the reflecting optic having a plurality of ring-shaped reflective surfaces and a light-transmissive body, each of the ring-shaped reflective surfaces associated with and in optical communication with one of the ring-shaped lenses;

each of the ring-shaped reflective surfaces being shaped and positioned to receive light from the light source and to reflect the received light through the light-transmissive body of the reflecting optic, at least a portion of the reflected light diverging from an optical axis of the reflecting optic, the rigid sheet and the light-transmissive body of the refracting optic towards one of the ring-shaped lenses associated with that one of the ring-shaped reflective surfaces, a ring-shaped focus of the one of the ring-shaped lenses associated with that one of the ring-shaped reflective surfaces being positioned near that ring-shaped reflective surface such that the divergent light from the ring-shaped reflective surfaces is refracted by the curved refracting surface of that lens and transmitted to the exterior of the illumination panel as a collimated beam of light.

22. The illumination panel of claim 21, wherein the reflecting optic further comprises a ring-shaped conditioning surface that receives light directly from the light source and reflects the received light towards the ring-shaped reflecting surfaces.

* * * * *